(12) United States Patent  (10) Patent No.: US 8,481,373 B2
Okabe et al.  (45) Date of Patent: Jul. 9, 2013

(54) METHOD FOR MANUFACTURING THIN FILM TRANSISTOR SUBSTRATE

(75) Inventors: Tohru Okabe, Osaka (JP); Hirohiko Nishiki, Osaka (JP); Yoshimasa Chikama, Osaka (JP); Takeshi Hara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/383,220

(22) PCT Filed: Mar. 16, 2010

(86) PCT No.: PCT/JP2010/001878

§ 371 (c)(1),
(2), (4) Date: Jan. 10, 2012

(87) PCT Pub. No.: WO2011/010415

PCT Pub. Date: Jan. 27, 2011

(65) Prior Publication Data

US 2012/0108018 A1 May 3, 2012

(30) Foreign Application Priority Data

Jul. 24, 2009 (JP) ................................. 2009-173160

(51) Int. Cl.
*H01L 21/336* (2006.01)
(52) U.S. Cl.
USPC ...... 438/151; 438/152; 438/155; 257/E21.37; 257/E21.411
(58) Field of Classification Search
USPC .................... 438/151, 152, 155; 257/E21.37, 257/E21.411
See application file for complete search history.

(56) References Cited

U.S. PATENT DOCUMENTS

| 6,255,130 | B1 | 7/2001 | Kim |
| 7,956,947 | B2 * | 6/2011 | Lee et al. .......................... 349/43 |
| 7,994,510 | B2 * | 8/2011 | Jeong et al. ...................... 257/72 |
| 2007/0215945 | A1 | 9/2007 | Tokunaga et al. |

(Continued)

FOREIGN PATENT DOCUMENTS

| JP | 2000-164886 A | 6/2000 |
| JP | 2008-040343 A | 2/2008 |

(Continued)

OTHER PUBLICATIONS

Official Communication issued in International Patent Application No. PCT/JP2010/001878, mailed on May 25, 2010.

*Primary Examiner* — Minchul Yang
(74) *Attorney, Agent, or Firm* — Keating & Bennett, LLP

(57) ABSTRACT

A method for manufacturing a thin film transistor substrate includes a step of forming a gate electrode (11a) and a first interconnect on a substrate (10), a step of forming a gate insulating film (12a) having a contact hole at a position overlapping the first interconnect, a step of forming a source electrode (13a) and a drain electrode (13b) overlapping the gate electrode (11a) and separated apart from each other, and a second interconnect connected via the contact hole to the first interconnect, a step of successively forming an oxide semiconductor film (14) and a second insulating film (15), and thereafter, patterning the second insulating film (15) to form an interlayer insulating film (15a), and a step of reducing the resistance of the oxide semiconductor film (14) exposed through the interlayer insulating film (15a) to form a pixel electrode (14b).

11 Claims, 12 Drawing Sheets

U.S. PATENT DOCUMENTS

| | | |
|---|---|---|
| 2008/0035920 A1 | 2/2008 | Takechi et al. |
| 2009/0101895 A1 | 4/2009 | Kawamura et al. |
| 2010/0127266 A1 | 5/2010 | Saito et al. |
| 2012/0058601 A1 | 3/2012 | Saito et al. |
| 2012/0132909 A1 | 5/2012 | Saito et al. |

FOREIGN PATENT DOCUMENTS

| | | |
|---|---|---|
| JP | 2008-176262 A | 7/2008 |
| JP | 2009-099887 A | 5/2009 |
| JP | 2010-123748 A | 6/2010 |

* cited by examiner

FIG.3
(a) 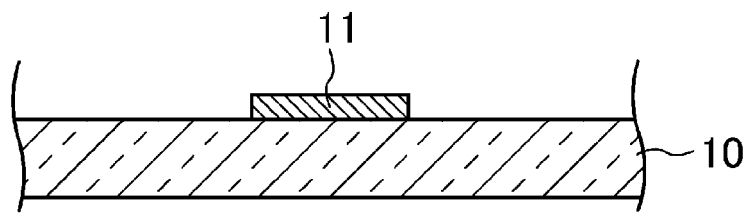
(b) 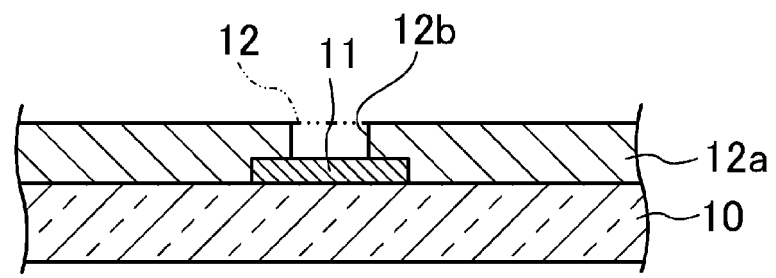
(c) 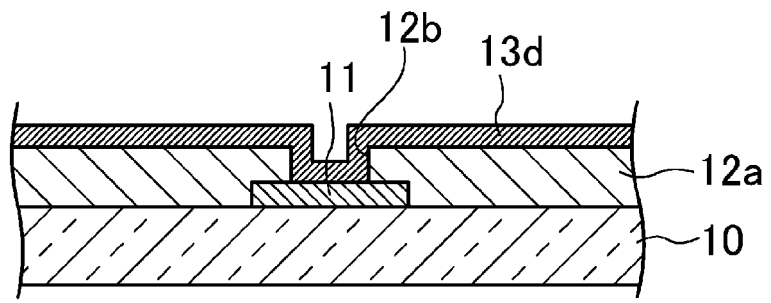
(d) 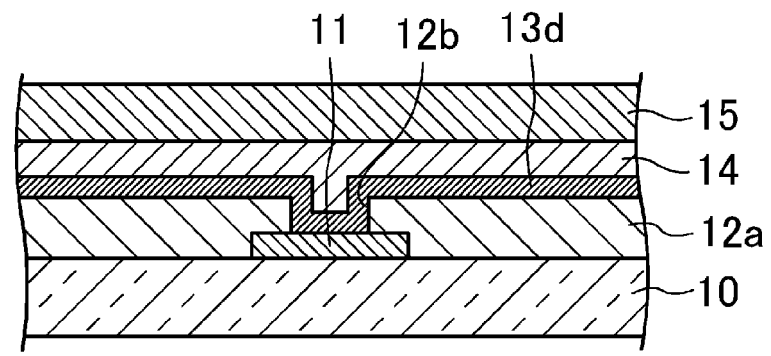

FIG.9
(a) 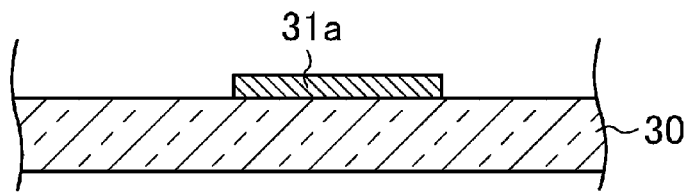
(b) 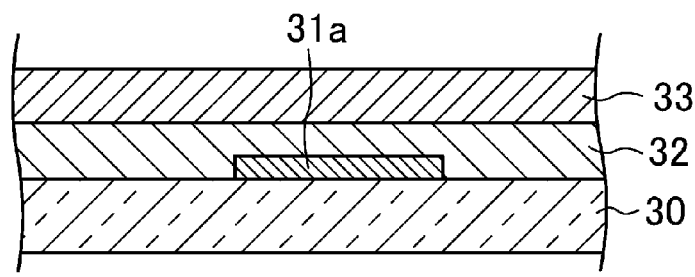
(c) 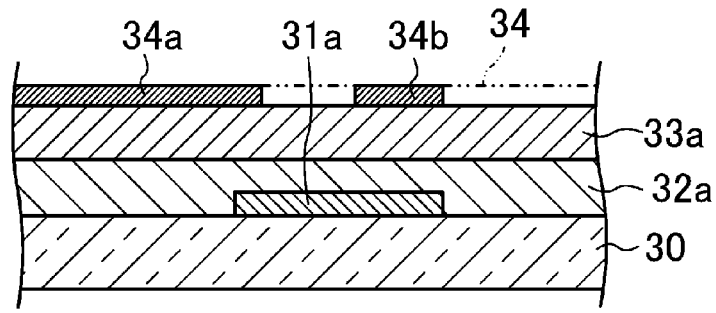
(d) 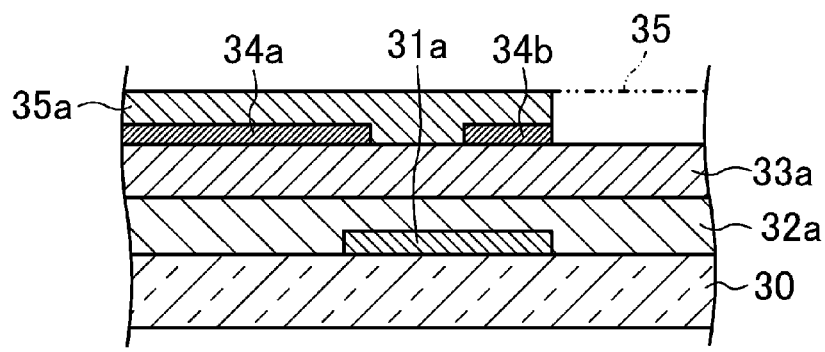
(e) 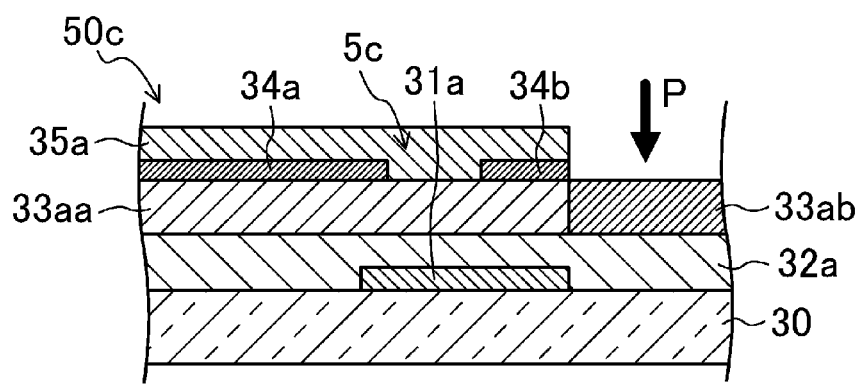

METHOD FOR MANUFACTURING THIN FILM TRANSISTOR SUBSTRATE

TECHNICAL FIELD

The present invention relates to methods for manufacturing thin film transistor substrates, and more particularly, to methods for manufacturing thin film transistor substrates for use in display panels.

BACKGROUND ART

An active matrix drive liquid crystal display panel includes a thin film transistor (hereinafter referred to as a "TFT") substrate on which a TFT serving as a switching element is provided in each pixel, which is the smallest unit of an image.

The TFT substrate can be manufactured in the following manner, for example. An etch film and a photosensitive resin film are successively formed on a glass substrate. Thereafter, the photosensitive resin film is exposed to light via a photomask to form a resist pattern. The etch film exposed through the resist pattern is etched. This series of steps is repeatedly performed.

Incidentally, in the liquid crystal display panel including the TFT substrate, in order to reduce the manufacturing cost, techniques for manufacturing the TFT substrate, such as increasing the size of the glass substrate and reducing the number of the photomasks, have been conventionally proposed.

For example, PATENT DOCUMENT 1 describes a TFT substrate manufacturing method in which a photomask with a halftone pattern is used to form a resist pattern having three different thicknesses, thereby reducing the number of photomasks.

In a conventional TFT substrate manufacturing method employing a silicon semiconductor film, a silicon film serving as a semiconductor film and a conductive oxide film serving as a pixel electrode are separately formed. In recent years, a high-performance next-generation TFT which employs an oxide semiconductor film as a semiconductor film has been proposed.

For example, PATENT DOCUMENT 2 describes a TFT array in which pixel electrodes are formed of an oxide semiconductor film which forms TFTs, and a method for manufacturing the TFT array.

CITATION LIST

Patent Documents

PATENT DOCUMENT 1: Japanese Patent Publication No. 2000-164886

PATENT DOCUMENT 2: Japanese Patent Publication No. 2008-40343

SUMMARY OF THE INVENTION

Technical Problem

FIGS. 13(a)-13(f) are cross-sectional views for describing a process of manufacturing a TFT substrate 150 corresponding to the TFT array of PATENT DOCUMENT 2.

Here, the TFT substrate 150 includes, for example, a plurality of gate lines (not shown) extending in parallel to each other, a plurality of source lines 113 (see FIG. 13(f)) extending in parallel to each other in a direction orthogonal to the gate lines, a plurality of TFTs 105 (see FIG. 13(f)) provided at respective corresponding intersections of the gate lines and the source lines 113, i.e., each for every pixel, which is the smallest unit of an image, and a plurality of pixel electrodes (114c, see FIG. 13(f)) arranged in a matrix and connected to the respective corresponding TFTs 105. Here, the TFT substrate 150 has a display region in which the pixel electrodes are arranged in a matrix and which is used to display an image, and a non-display region which is provided around the display region. In the non-display region of the TFT substrate 150, the gate line is connected via a contact hole formed in a gate insulating film 112 described below to a connection line provided in the same layer in which the source line 113 is provided and made of the same material as that of the source line 113.

For example, as shown in FIG. 13(f), the TFT 105 includes a gate electrode 111 which is a portion or a protruding portion of the gate line on the glass substrate 110, the gate insulating film 112 provided to cover the gate electrode 111, and a semiconductor layer 114 provided on the gate insulating film 112, overlapping the gate electrode 111. Here, for example, as shown in FIG. 13(f), the semiconductor layer 114 includes a channel region 114a overlapping the gate electrode 111, a source region 114b adjacent to and on the left side of the channel region 114a and connected to the source line 113, and the drain region 114c adjacent to and on the right side of the channel region 114a and included in the pixel electrode.

A method for manufacturing the TFT substrate 150 having the above configuration will be roughly described hereinafter.

Initially, as shown in FIG. 13(a), the gate electrode 111 is formed on the glass substrate 110 using a first photomask.

Next, as shown in FIG. 13(b), the gate insulating film 112 which covers the gate electrode 111 and has a contact hole (not shown) in the non-display region is formed using a second photomask.

Thereafter, as shown in FIG. 13(c), the source line 113 is formed on the gate insulating film 112 using a third photomask.

Moreover, as shown in FIG. 13(d), the oxide semiconductor layer 114 is formed on the gate insulating film 112 and the source line 113 using a fourth photomask.

Thereafter, as shown in FIG. 13(e), an interlayer insulating film 115 is formed on the source interconnect 113 and the oxide semiconductor layer 114 using a fifth photomask.

Finally, as shown in FIG. 13(f), the oxide semiconductor layer 114 exposed through the interlayer insulating film 115 is treated with a plasma P to reduce the resistance, thereby forming the channel region 114a, the source region 114b, and the drain region (pixel electrode) 114c.

Thus, the TFT substrate 150 can be manufactured using the five photomasks.

However, in the TFT substrate 150, the source region 114b and the drain region 114c damaged by the plasma treatment are adjacent to the channel region 114a, and therefore, the characteristics of the TFT 105 are likely to be defective. Moreover, although the manufacturing process requires the five photomasks, the source region 114b of the oxide semiconductor layer 114 excluding the drain region 114c functioning as a pixel electrode is not covered with the interlayer insulating film 115, and therefore, for example, in a liquid crystal display panel including the TFT substrate 150, the potential of the source line 113 is applied directly to the liquid crystal layer, and therefore, in the actual manufacturing process, an additional step of providing any insulating film covering the source region 114b is required. Therefore, there is a room for improvement.

The present invention has been made in view of the above problems. It is an object of the present invention to manufacture a thin film transistor made of an oxide semiconductor and having satisfactory characteristics and a thin film transistor substrate having an interconnection structure at a substrate end portion thereof at as low a cost as possible.

Solution to the Problem

To achieve the object, according to the present invention, the oxide semiconductor film for forming the pixel electrode is not patterned singly, and a portion for forming a thin film transistor of the oxide semiconductor film is covered with an interlayer insulating film.

Specifically, a method for manufacturing a thin film transistor substrate according to the present invention includes a gate layer formation step of forming a gate electrode and a first interconnect on a substrate, a gate insulating film formation step of forming a first insulating film covering the gate electrode and the first interconnect, and thereafter, patterning the first insulating film to form a contact hole at a position overlapping the first interconnect, thereby forming a gate insulating film, a source layer formation step of forming a conductive film covering the gate insulating film, and thereafter, patterning the conductive film to form a source electrode and a drain electrode overlapping the gate electrode and separated apart from each other, and a second interconnect intersecting the first interconnect and connected via the contact hole to the first interconnect, an interlayer insulating film formation step of successively forming an oxide semiconductor film and a second insulating film covering the source electrode, the drain electrode, and the second interconnect, and thereafter, patterning the second insulating film to form an interlayer insulating film, and a pixel electrode formation step of reducing the resistance of the oxide semiconductor film exposed through the interlayer insulating film to form a pixel electrode.

With the above method, initially, in the gate layer formation step, for example, the (first) conductive film is formed on the substrate, and thereafter, the (first) conductive film exposed through a first resist pattern formed using a first photomask is patterned to form the gate electrode and the first interconnect. Next, in the gate insulating film formation step, the first insulating film is formed on the gate electrode and the first interconnect, and thereafter, the first insulating film exposed through a second resist pattern formed using a second photomask is patterned to form the gate insulating film having the contact hole for forming an interconnection structure at a substrate end portion. Thereafter, in the source layer formation step, the (second) conductive film is formed on the gate insulating film, and thereafter, the (second) conductive film exposed through a third resist pattern formed using a third photomask is patterned to form the source electrode, the drain electrode, and the second interconnect. Here, the first and second interconnects are connected to each other via the contact hole formed in the gate insulating film, and therefore, an interconnection structure is specifically formed at the substrate end portion. Moreover, in the interlayer insulating film formation step, the oxide semiconductor film and the second insulating film are successively formed on the source electrode, the drain electrode, and the second interconnect, and thereafter, the second insulating film exposed through a fourth resist pattern formed using a fourth photomask is patterned to form the interlayer insulating film. Finally, in the pixel electrode formation step, the resistance of the oxide semiconductor film exposed through the interlayer insulating film is reduced to form the pixel electrode. As a result, the thin film transistor substrate is manufactured using four of the first, second, third, and fourth photomasks, and therefore, a thin film transistor substrate having an interconnection structure at a substrate end portion thereof is manufactured at as low a cost as possible. Also, in the manufactured thin film transistor substrate, a portion forming the thin film transistor of the oxide semiconductor film is covered with the interlayer insulating film, and therefore, is less likely to be damaged by a plasma supplied for the resistance reduction, etc., resulting in satisfactory characteristics of the thin film transistor. Therefore, a thin film transistor made of an oxide semiconductor and having satisfactory characteristics, and a thin film transistor substrate having an interconnection structure at a substrate end portion thereof, are manufactured at as low a cost as possible.

Another method for manufacturing a thin film transistor substrate according to the present invention includes a gate layer formation step of forming a gate electrode and a first interconnect on a substrate, a gate insulating film formation step of successively forming a first insulating film and an oxide semiconductor film covering the gate electrode and the first interconnect, and thereafter, patterning the multilayer film of the first insulating film and the oxide semiconductor film to form a contact hole at a position overlapping the first interconnect, thereby forming a gate insulating film, a source layer formation step of forming a conductive film covering the oxide semiconductor film, and thereafter, patterning the conductive film to form a source electrode and a drain electrode overlapping the gate electrode and separated apart from each other, and a second interconnect intersecting the first interconnect and connected via the contact hole to the first interconnect, an interlayer insulating film formation step of forming a second insulating film covering the source electrode, the drain electrode, and the second interconnect, and thereafter, patterning the second insulating film to form an interlayer insulating film, and a pixel electrode formation step of reducing the resistance of the oxide semiconductor film exposed through the interlayer insulating film to form a pixel electrode With the above method, initially, in the gate layer formation step, for example, the (first) conductive film is formed on the substrate, and thereafter, the (first) conductive film exposed through a first resist pattern formed using a first photomask is patterned to form the gate electrode and the first interconnect. Next, in the gate insulating film formation step, the first insulating film and the oxide semiconductor film are successively formed on the gate electrode and the first interconnect, and thereafter, the multilayer film of the first insulating film and the oxide semiconductor film exposed through a second resist pattern formed using a second photomask is patterned to form the gate insulating film having the contact hole for forming an interconnection structure at a substrate end portion. Thereafter, in the source layer formation step, the (second) conductive film is formed on the oxide semiconductor film, and thereafter, the (second) conductive film exposed through a third resist pattern formed using a third photomask is patterned to form the source electrode, the drain electrode, and the second interconnect. Here, the first and second interconnects are connected to each other via the contact hole formed in the gate insulating film (the multilayer film of the first insulating film and the oxide semiconductor film), and therefore, an interconnection structure is specifically formed at the substrate end portion. Moreover, in the interlayer insulating film formation step, the second insulating film is formed on the source electrode, the drain electrode, and the second interconnect, and thereafter, the second insulating film exposed through a fourth resist pattern formed using a fourth photomask is patterned to form the interlayer insulating film. Finally, in the pixel electrode formation step, the resistance of the oxide semiconductor film exposed through the interlayer insulating film is reduced to form the pixel electrode. As a result, the thin film transistor substrate is manufactured using four of the first, second, third, and fourth photomasks, and therefore, a thin film transistor substrate having an interconnection structure at a substrate end portion thereof is manufactured at as low a cost as possible. Also, in the manufactured thin film transistor substrate, a portion forming the thin film transistor of the oxide semiconductor film is covered with the interlayer insulating film, and therefore, is less likely to be damaged by a plasma supplied for the resistance reduction, etc., resulting in satisfactory characteristics of the thin film transistor. Therefore, a thin film transistor made of an oxide semiconductor and having satisfactory characteristics, and a thin film transistor substrate having an interconnection structure at a substrate end portion thereof, are manufactured at as low a cost as possible.

In the gate layer formation step, the gate electrode may be made wide enough to reach a boundary between the drain electrode formed in the source layer formation step and the pixel electrode formed in the pixel electrode formation step.

With the above method, the gate electrode is made wide enough to reach a boundary between the drain electrode and the pixel electrode. Therefore, when the gate electrode is maintained at a high voltage, the resistance of the semiconductor layer below the drain electrode is reduced, and therefore, the drain electrode and the pixel electrode can be reliably connected to each other.

Another method for manufacturing a thin film transistor substrate according to the present invention includes a gate layer formation step of forming a gate electrode and a first interconnect on a substrate, a gate insulating film formation step of successively forming a first insulating film and a conductive film covering the gate electrode and the first interconnect, and thereafter, patterning the multilayer film of the first insulating film and the conductive film to form a contact hole at a position overlapping the first interconnect, thereby forming a gate insulating film, a source layer formation step of patterning the conductive film to form a source electrode and a drain electrode overlapping the gate electrode and separated apart from each other, and a second interconnect intersecting the first interconnect at the position of the contact hole, an interlayer insulating film formation step of successively forming an oxide semiconductor film and a second insulating film covering the source electrode, the drain electrode, and the second interconnect, and thereafter, patterning the second insulating film to form an interlayer insulating film, and a pixel electrode formation step of reducing the resistance of the oxide semiconductor film exposed through the interlayer insulating film to form a pixel electrode, and causing the first and second interconnects to be conductive.

With the above method, initially, in the gate layer formation step, for example, the (first) conductive film is formed on the substrate, and thereafter, the (first) conductive film exposed through a first resist pattern formed using a first photomask is patterned to form the gate electrode and the first interconnect. Next, in the gate insulating film formation step, the first insulating film and the (second) conductive film are successively formed on the gate electrode and the first interconnect, and thereafter, the multilayer film of the first insulating film and the (second) conductive film exposed through a second resist pattern formed using a second photomask is patterned to form the gate insulating film having the contact hole for forming an interconnection structure at a substrate end portion. Thereafter, in the source layer formation step, the (second) conductive film exposed through a third resist pattern formed using a third photomask is patterned to form the source electrode, the drain electrode, and the second interconnect. Moreover, in the interlayer insulating film formation step, the oxide semiconductor film and the second insulating film are successively formed on the source electrode, the drain electrode, and the second interconnect, and thereafter, the second insulating film exposed through a fourth resist pattern formed using a fourth photomask is patterned to form the interlayer insulating film. Finally, in the pixel electrode formation step, the resistance of the oxide semiconductor film exposed through the interlayer insulating film is reduced to form the pixel electrode, and the first and second interconnects are caused to be conductive. Here, the first and second interconnects are connected to each other via a conductive portion having a reduced resistance of the oxide semiconductor film inside the contact hole formed in the gate insulating film (the multilayer film of the first insulating film and the second conductive film), and therefore, an interconnection structure is specifically formed at the substrate end portion. As a result, the thin film transistor substrate is manufactured using four of the first, second, third, and fourth photomasks, and therefore, a thin film transistor substrate having an interconnection structure at a substrate end portion thereof is manufactured at as low a cost as possible. Also, in the manufactured thin film transistor substrate, a portion forming the thin film transistor of the oxide semiconductor film is covered with the interlayer insulating film, and therefore, is less likely to be damaged by a plasma supplied for the resistance reduction, etc., resulting in satisfactory characteristics of the thin film transistor. Therefore, a thin film transistor made of an oxide semiconductor and having satisfactory characteristics, and a thin film transistor substrate having an interconnection structure at a substrate end portion thereof, are manufactured at as low a cost as possible.

The gate insulating film formation step may include a step of forming a photosensitive resin film on the conductive film and performing a halftone exposure of the photosensitive resin film to form a resist pattern with a recessed portion, and a step of etching the multilayer film of the first insulating film and the conductive film exposed through the resist pattern to form the contact hole. In the source layer formation step, a thickness of the resist pattern may be reduced to remove a bottom portion of the recessed portion of the resist pattern to expose the conductive film, and the exposed conductive film may be patterned by etching.

With the above method, in the gate insulating film formation step, initially, the first insulating film, the (second) conductive film, and the photosensitive resin film are successively formed on the gate electrode and the first interconnect, and thereafter, the photosensitive resin film is subjected to halftone exposure using the second photomask to form the second resist pattern having the recessed portion. Next, the multilayer film of the first insulating film and the (second) conductive film exposed through the second resist pattern is etched to form the gate insulating film having the contact hole. Thereafter, in the source layer formation step, the thickness of the second resist pattern is reduced to remove the bottom portion of the recessed portion of the second resist pattern to expose the (second) conductive film, and the exposed (second) conductive film is etched to form the source electrode, the drain electrode, and the second interconnect. As a result, the aforementioned third photomask is no longer required, and the thin film transistor substrate is manufactured using three of the first, second, and fourth photomasks, and therefore, the thin film transistor substrate is manufactured at an even lower cost.

In the pixel electrode formation step, the oxide semiconductor film exposed through the interlayer insulating film may be treated with a plasma.

With the above method, in the pixel electrode formation step, the oxide semiconductor film exposed through the interlayer insulating film is treated with a plasma. Therefore, a so-called threshold voltage (Vth) of the thin film transistor is shifted in the negative direction, and therefore, the resistance of the oxide semiconductor film exposed through the interlayer insulating film, i.e., the pixel electrode, is specifically reduced.

In the pixel electrode formation step, an impurity may be implanted into the oxide semiconductor film exposed through the interlayer insulating film.

With the above method, in the pixel electrode formation step, an impurity is implanted into the oxide semiconductor film exposed through the interlayer insulating film. Therefore, a so-called threshold voltage (Vth) of the thin film transistor is shifted in the negative direction, and therefore, the resistance of the oxide semiconductor film exposed through the interlayer insulating film, i.e., the pixel electrode, is specifically reduced.

In the pixel electrode formation step, a thickness of the oxide semiconductor film exposed through the interlayer insulating film may be reduced by etching.

With the above method, in the pixel electrode formation step, a thickness of the oxide semiconductor film exposed through the interlayer insulating film is reduced by etching. Therefore, a so-called threshold voltage (Vth) of the thin film transistor is shifted in the negative direction, and therefore, the resistance of the oxide semiconductor film exposed through the interlayer insulating film, i.e., the pixel electrode, is specifically reduced.

The second interconnect may be a source line conductive to the source electrode. The first interconnect may be a first connection line configured to connect to the source line.

With the above method, the second interconnect is a source line, and the first interconnect is a first connection line configured to connect to the source line. Therefore, the source line is extended to a terminal region etc. of the non-display region of the substrate end portion via the first connection line formed in the same layer in which the gate electrode is provided and made of the same material as that of the gate electrode.

The first interconnect may be a gate line conductive to the gate electrode. The second interconnect may be a second connection line configured to connect to the gate line.

With the above method, the first interconnect is a gate line, and the second interconnect is a second interconnect configured to connect to the gate line. Therefore, the gate line is extended to a terminal region etc. of the non-display region of the substrate end portion via the second connection line formed in the same layer in which the source electrode is provided and made of the same material as that of the source electrode.

Advantages of the Invention

According to the present invention, an oxide semiconductor film for forming a pixel electrode is not patterned singly, and a portion for forming a thin film transistor of the oxide semiconductor film is covered with an interlayer insulating film. Therefore, a thin film transistor made of an oxide semiconductor and having satisfactory characteristics, and a thin film transistor substrate having an interconnection structure at a substrate end portion thereof, can be manufactured at as low a cost as possible.

BRIEF DESCRIPTION OF THE DRAWINGS

FIG. 3 is a cross-sectional view of a non-display region for describing the process of manufacturing the TFT substrate 50aa.

FIG. 9 is a cross-sectional view of a display region for describing a process of manufacturing a TFT substrate 50c according to a third embodiment.

DESCRIPTION OF EMBODIMENTS

Embodiments of the present invention will be described in detail hereinafter with reference to the accompanying drawings. Note that the present invention is not limited to the embodiments described below.

<<First Embodiment of the Invention>>

Figure 1:
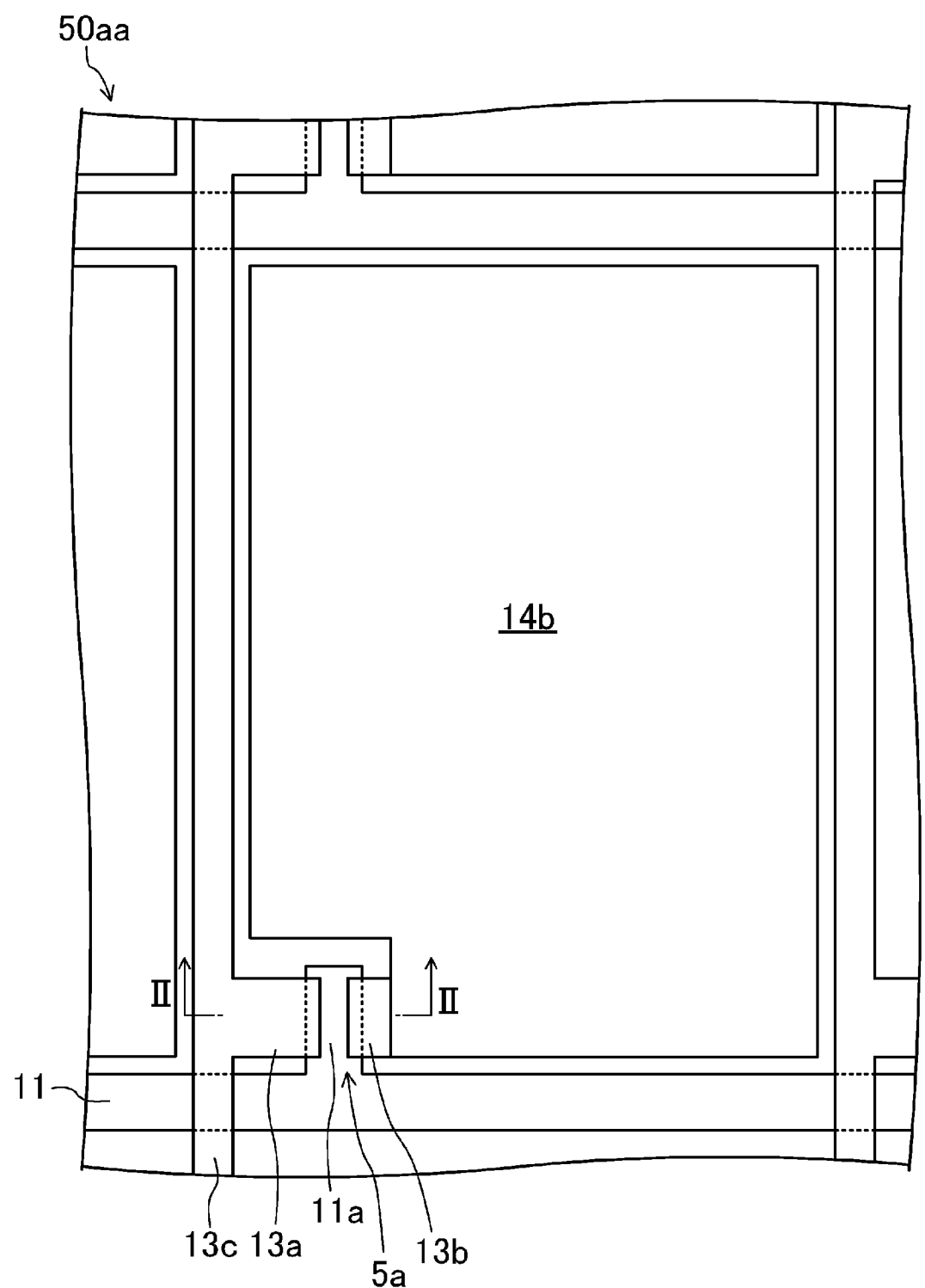
FIG. 1 is a plan view of a TFT substrate 50aa according to a first embodiment.
Figure 4:
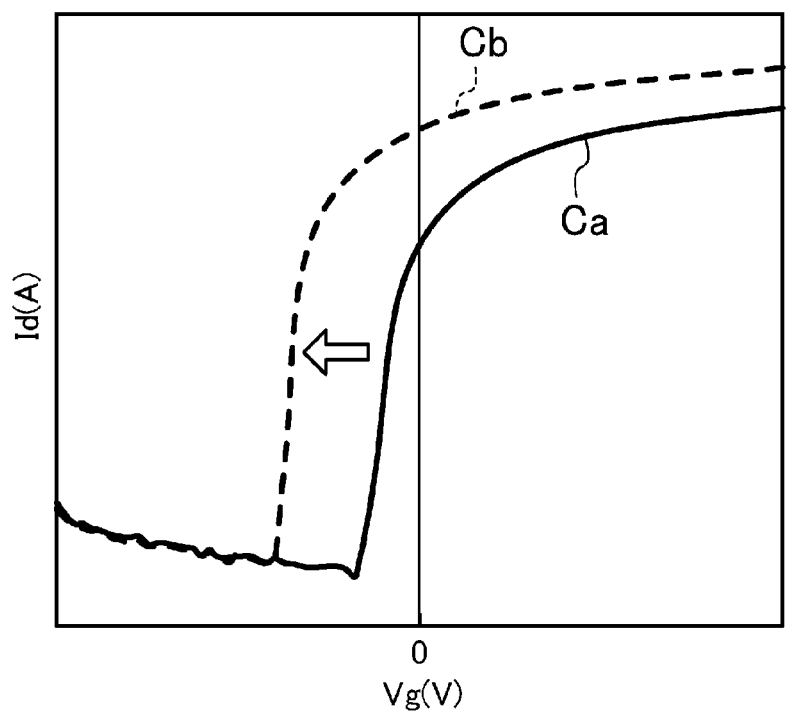
FIG. 4 is a graph showing characteristics of a TFT 5a included in the TFT substrate 50aa.
Figure 5:
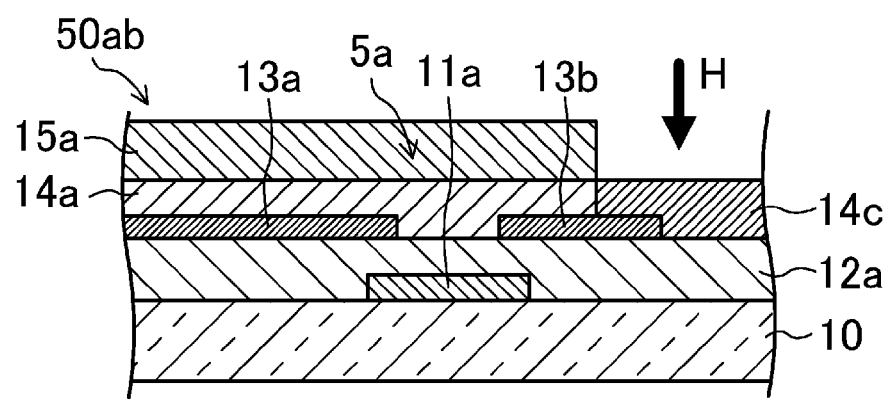
FIG. 5 is a cross-sectional view of a TFT substrate 50ab according to the first embodiment.
Figure 6:
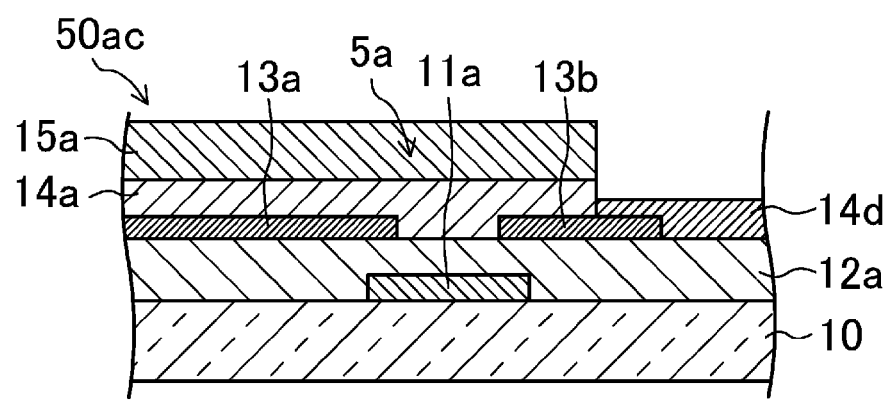
FIG. 6 is a cross-sectional view of a TFT substrate 50ac according to the first embodiment.

FIGS. 1-6 show a first embodiment of a thin film transistor substrate according to the present invention. Specifically, FIG. 1 is a plan view of a TFT substrate 50aa of the first embodiment. FIGS. 2(a)-2(f) are cross-sectional views of a display region for describing a process of manufacturing the TFT substrate 50aa. FIGS. 3(a)-3(d) are cross-sectional views of a non-display region for describing the process of manufacturing the TFT substrate 50aa. Note that FIG. 2(f) is a cross-sectional view of the TFT substrate 50aa, taken along line II of FIG. 1. Note that FIG. 4 is a graph showing characteristics of a TFT 5 included in the TFT substrate 50aa.

As shown in FIGS. 1 and 2(f), the TFT substrate 50aa includes a glass substrate 10, a plurality of gate lines 11 provided on the glass substrate 10, extending in parallel to each other, a plurality of source lines 13c extending in parallel to each other in a direction orthogonal to the gate lines 11, a plurality of TFTs 5a provided at respective corresponding intersections of the gate lines 11 and the source lines 13c, i.e., each for every pixel, which is the smallest unit of an image, an interlayer insulating film 15a provided to cover the TFTs 5a, and a plurality of pixel electrodes 14b provided in respective corresponding openings formed and arranged in a matrix in the interlayer insulating film 15a and connected to the respective corresponding TFTs 5a. Here, on the TFT substrate 50aa, a plurality of pixels (pixel electrodes 14b) are arranged in a matrix, which form a display region where an image is displayed, and a non-display region is provided around the display region. The gate line 11 is extended to the non-display region and are connected to a second connection line 13d via a contact hole 12b formed in a gate insulating film 12a, so that an interconnection structure is formed at a substrate end portion (see FIGS. 3(c) and 3(d)).

As shown in FIGS. 1 and 2(f), the TFT 5a includes a gate electrode 11a provided on the glass substrate 10, the gate insulating film 12a provided to cover the gate electrode 11a, a source electrode 13a and a drain electrode 13b provided on the gate insulating film 12a, overlapping the gate electrode 11a and being separated apart from each other, and a semiconductor layer 14a provided on the gate insulating film 12a, overlapping the gate electrode 11a with the source electrode 13a and the drain electrode 13b being interposed between the semiconductor layer 14a and the gate electrode 11a. Here, as shown in FIG. 1, the gate electrode 11a is a portion protruding sideways from the gate line 11, and the source electrode 13a is a portion protruding sideways from the source line 13c and connected to a source region of the semiconductor layer 14a. The drain electrode 13b is connected to a drain region of the semiconductor layer 14a and the pixel electrode 14b.

The semiconductor layer 14a and the pixel electrode 14b are formed of, for example, a transparent oxide semiconductor film made of In—Ga—Zn—O (IGZO), In—Si—Zn—O (ISiZO), or In—Al—Zn—O (IAlZO), etc. Here, as shown in FIGS. 2(e) and 2(f), the pixel electrode 14b is a portion of the oxide semiconductor film 14 which is exposed through the interlayer insulating film 15a, and as shown in FIG. 4, has a lower electrical resistance than that of the semiconductor layer 14a. Note that, in FIG. 4, a curve Ca indicates characteristics of the TFT 5a having the semiconductor layer 14a, a curve Cb indicates characteristics of a TFT having a semiconductor layer corresponding to the pixel electrode 14b having a reduced resistance. The oxide semiconductor film cannot be directly used as a pixel electrode, because the oxide semiconductor film has a high electrical resistance when the gate voltage Vg is 0 V (see the curve Ca in FIG. 4). As shown in FIG. 4, however, if the oxide semiconductor film is treated with a plasma of $N_2O$ or hydrogen, the threshold voltage (Vth) of the TFT is shifted in the negative direction (see the curve Cb in FIG. 4), and if the electrical resistance where the gate voltage Vg is 0 V is set to be equal to about the on resistance, the oxide semiconductor film can be used as a pixel electrode.

For example, the TFT substrate 50aa thus configured, a color filter (CF) substrate opposed to the TFT substrate 50aa, and a liquid crystal layer sandwiched between these substrates constitute a liquid crystal display panel.

Figure 2:
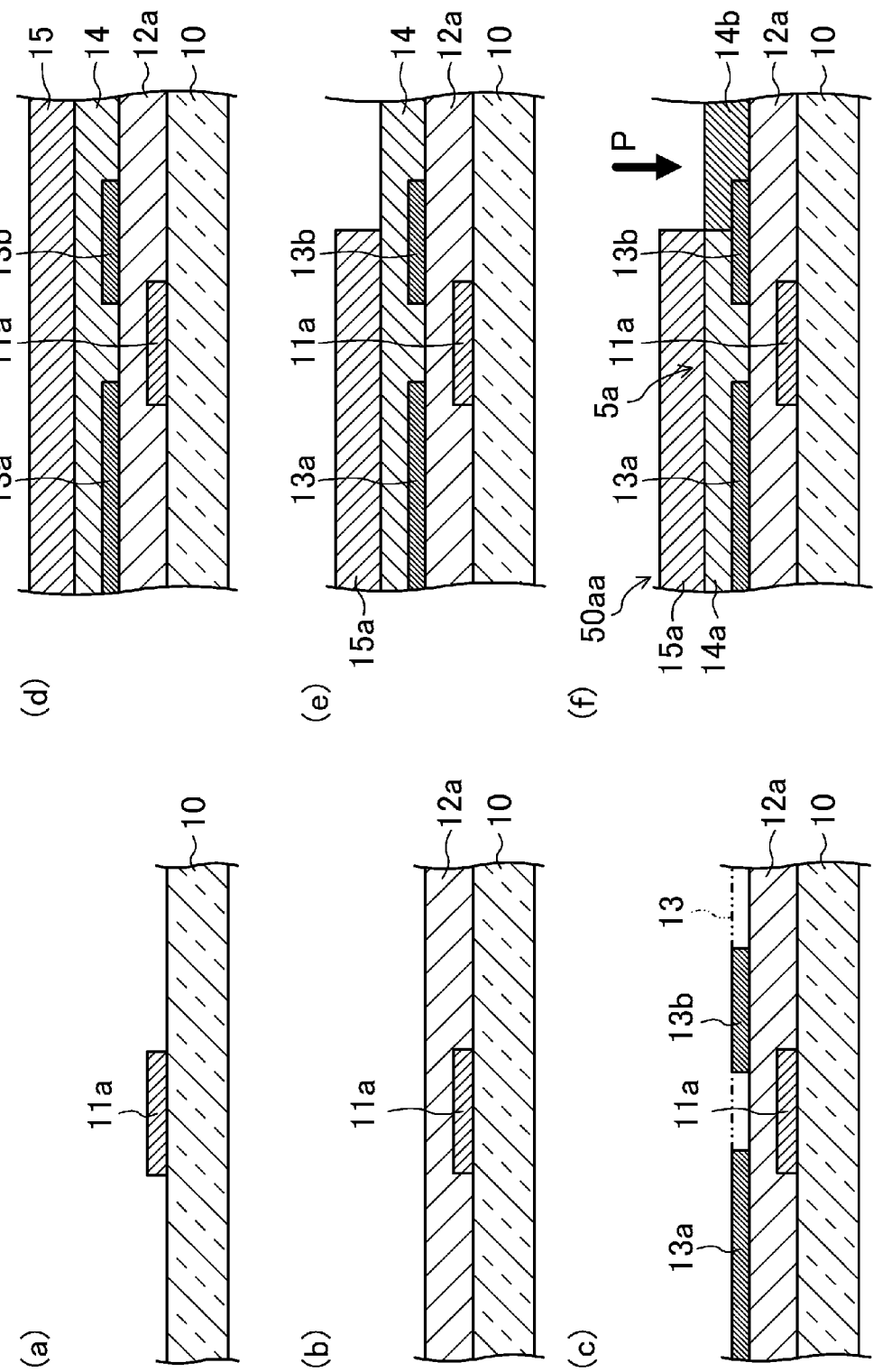
FIG. 2 is a cross-sectional view of a display region for describing a process of manufacturing the TFT substrate 50aa.

Next, a method for manufacturing the TFT substrate 50aa of this embodiment will be described with reference to FIGS. 2 and 3. Note that the manufacturing method of this embodiment includes a gate layer formation step, a gate insulating film formation step, a source layer formation step, an interlayer insulating film formation step, and a pixel electrode formation step.

<Gate Layer Formation Step>

Initially, for example, a first metal conductive film (not shown), such as an aluminum film, a copper film, or a titanium film, etc., which has a thickness of about 3000 Å is formed on the entire glass substrate 10 having a thickness of 0.7 mm by sputtering.

Next, a photosensitive resin film (not shown) is applied onto the entire substrate on which the first metal conductive film has been formed, by spin coating, and thereafter, the photosensitive resin film is patterned using a first photomask (not shown) to form a first resist pattern (not shown).

Moreover, as shown in FIGS. 2(a) and 3(a), the first metal conductive film exposed through the first resist pattern is removed by wet etching, and thereafter, the first resist pattern is peeled off to form the gate electrode 11a and the gate line 11.

<Gate Insulating Film Formation Step>

Initially, the first inorganic insulating film 12 (see FIG. 3(b)), such as a silicon nitride film or a silicon oxide film, etc., which has a thickness of about 4000 Å is formed on the entire substrate on which the gate electrode 11a and the gate line 11 have been formed in the gate layer formation step, by plasma-enhanced chemical vapor deposition (CVD).

Next, a photosensitive resin film (not shown) is applied onto the entire substrate on which the first inorganic insulating film 12 has been formed, by spin coating, and thereafter, the photosensitive resin film is patterned using a second photomask (not shown) to form a second resist pattern (not shown).

Moreover, as shown in FIGS. 2(b) and 3(b), the first inorganic insulating film 12 exposed through the second resist pattern is removed by dry etching, and thereafter, the second resist pattern is peeled off to form the gate insulating film 12a having the contact hole 12b.

<Source Layer Formation Step>

Initially, a second metal conductive film 13 (see FIG. 2(c)), such as an aluminum film, a copper film, or a titanium film, etc., which has a thickness of about 3000 Å is formed on the entire substrate on which the gate insulating film 12a has been formed in the gate insulating film formation step, by sputtering.

Next, a photosensitive resin film (not shown) is applied onto the entire substrate on which the second metal conductive film 13 has been formed, by spin coating, and thereafter, the photosensitive resin film is patterned using a third photomask (not shown) to form a third resist pattern (not shown).

Moreover, as shown in FIGS. 2(c) and 3(c), the second metal conductive film 13 exposed through the third resist pattern is removed by wet etching to form the source electrode 13a, the drain electrode 13b, the source line 13c, and the second connection line 13d.

<Interlayer Insulating Film Formation Step>

Initially, the oxide semiconductor film 14 made of IGZO, ISiZO, or IAlZO, etc., and having a thickness of about 1000 Å is formed on the entire substrate on which the source electrode 13a, the drain electrode 13b, the source line 13c, and the second connection line 13d have been formed in the source layer formation step, by sputtering (see FIGS. 2(d) and 3(d)).

Next, as shown in FIGS. 2(d) and 3(d), a second inorganic insulating film 15, such as a silicon nitride film or a silicon oxide film, etc., which has a thickness of about 3000 Å is formed on the entire substrate on which the oxide semiconductor film 14 has been formed, by sputtering or plasma-enhanced CVD.

Thereafter, a photosensitive resin film (not shown) is applied onto the entire substrate on which the second inorganic insulating film 15 has been formed, by spin coating, and thereafter, the photosensitive resin film is patterned using a fourth photomask (not shown) to form a fourth resist pattern (not shown).

Moreover, as shown in FIG. 2(e), the second inorganic insulating film 15 exposed through the fourth resist pattern is removed by dry etching to form the interlayer insulating film 15a.

<Pixel Electrode Formation Step>

As shown in FIG. 2(f), the oxide semiconductor film 14 (see FIG. 2(e)) exposed through the interlayer insulating film 15a formed in the interlayer insulating film formation step is treated with a reducing plasma P of hydrogen, argon, or oxygen, etc., to reduce the resistance of the oxide semiconductor film 14 exposed through the interlayer insulating film 15a, thereby forming the pixel electrode 14b, and the semiconductor layer 14a below the interlayer insulating film 15a.

Here, in this embodiment, as described above, the interlayer insulating film formation step and the pixel electrode formation step are assumed to be separate steps. Alternatively, in the interlayer insulating film formation step, the second inorganic insulating film 15 may be removed by dry etching, and next, the reducing plasma P treatment may be performed, and thereafter, the fourth resist pattern may be peeled off, whereby the manufacturing process can be shortened.

Thus, the TFT substrate 50aa of this embodiment can be manufactured.

As described above, according to the method for manufacturing the TFT substrate 50aa of this embodiment, initially, in the gate layer formation step, the first metal conductive film is formed on the glass substrate 10, and thereafter, the first metal conductive film exposed through the first resist pattern formed using the first photomask is patterned to form the gate electrode 11a and the gate line (first interconnect) 11. Next, in the gate insulating film formation step, the first inorganic insulating film is formed on the gate electrode 11a and the gate line 11, and thereafter, the first inorganic insulating film exposed through the second resist pattern formed using the second photomask is patterned to form the gate insulating film 12a having the contact hole 12b for forming an interconnection structure at the substrate end portion. Thereafter, in the source layer formation step, the second metal conductive film is formed on the gate insulating film 12a, and thereafter, the second metal conductive film exposed through the third resist pattern formed using the third photomask is patterned to form the source electrode 13a, the drain electrode 13b, the source line 13c, and the second connection line (second interconnect) 13d. Here, the gate line 11 and the second connection line 13d are connected to each other via the contact hole 12b formed in the gate insulating film 12a. Therefore, at the substrate end portion, an interconnection structure can be specifically formed. Moreover, in the interlayer insulating film formation step, the oxide semiconductor film 14 and the second inorganic insulating film 15 are successively formed on the source electrode 13a, the drain electrode 13b, the source line 13c, and the second connection line 13d, and thereafter, the second inorganic insulating film 15 exposed through the fourth resist pattern formed using the fourth photomask is patterned to form the interlayer insulating film 15a. Finally, in the pixel electrode formation step, the resistance of the oxide semiconductor film 14 exposed through the interlayer insulating film 15a is reduced to form the pixel electrode 14b. As a result, the TFT substrate 50aa can be manufactured by using four of the first, second, third, and fourth photomasks, and therefore, a TFT substrate having an interconnection structure at a substrate end portion thereof can be manufactured at as low a cost as possible. In the manufactured TFT substrate 50aa, a portion forming the TFT 5a of the oxide semiconductor film 14 (the semiconductor layer 14a) is covered with the interlayer insulating film 15a, and therefore, is less likely to be damaged by the reducing plasma P supplied for the resistance reduction, etc., resulting in satisfactory characteristics of the TFT 5a. Therefore, a TFT made of an oxide semiconductor and having satisfactory characteristics, and a TFT substrate having an interconnection structure at a substrate end portion thereof, can be manufactured at as low a cost as possible.

In this embodiment, an example method for forming the pixel electrode 14b by treating the oxide semiconductor film 14 exposed through the interlayer insulating film 15a with a plasma and thereby reducing the resistance of a portion of the oxide semiconductor film 14 has been described. Alternatively, in the present invention, a TFT substrate 50ab shown in FIG. 5 may be formed in which a pixel electrode 14c is provided by implanting an impurity H, such as a hydrogen ion etc., into the oxide semiconductor film 14 exposed through the interlayer insulating film 15a and thereby reducing a portion of the oxide semiconductor film 14. Alternatively, a TFT substrate 50ac shown in FIG. 6 may be formed in which a pixel electrode 14d is formed by reducing a thickness of the oxide semiconductor film 14 exposed through the interlayer insulating film 15a by wet etching and thereby reducing the resistance of a portion of the oxide semiconductor film 14.

<<Second Embodiment of the Invention>>

Figure 7:
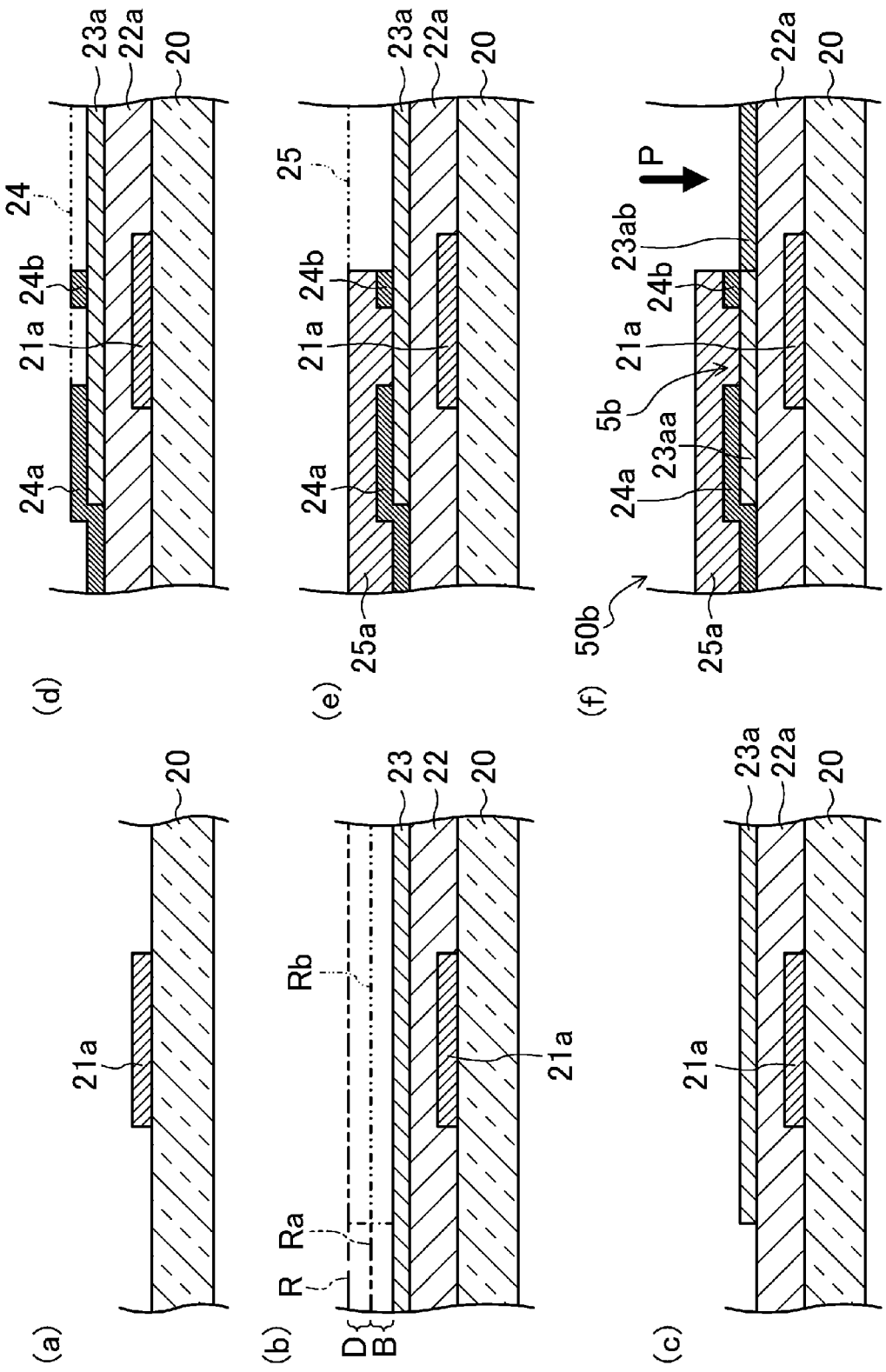
FIG. 7 is a cross-sectional view of a display region for describing a process of manufacturing a TFT substrate 50b according to a second embodiment.
Figure 8:
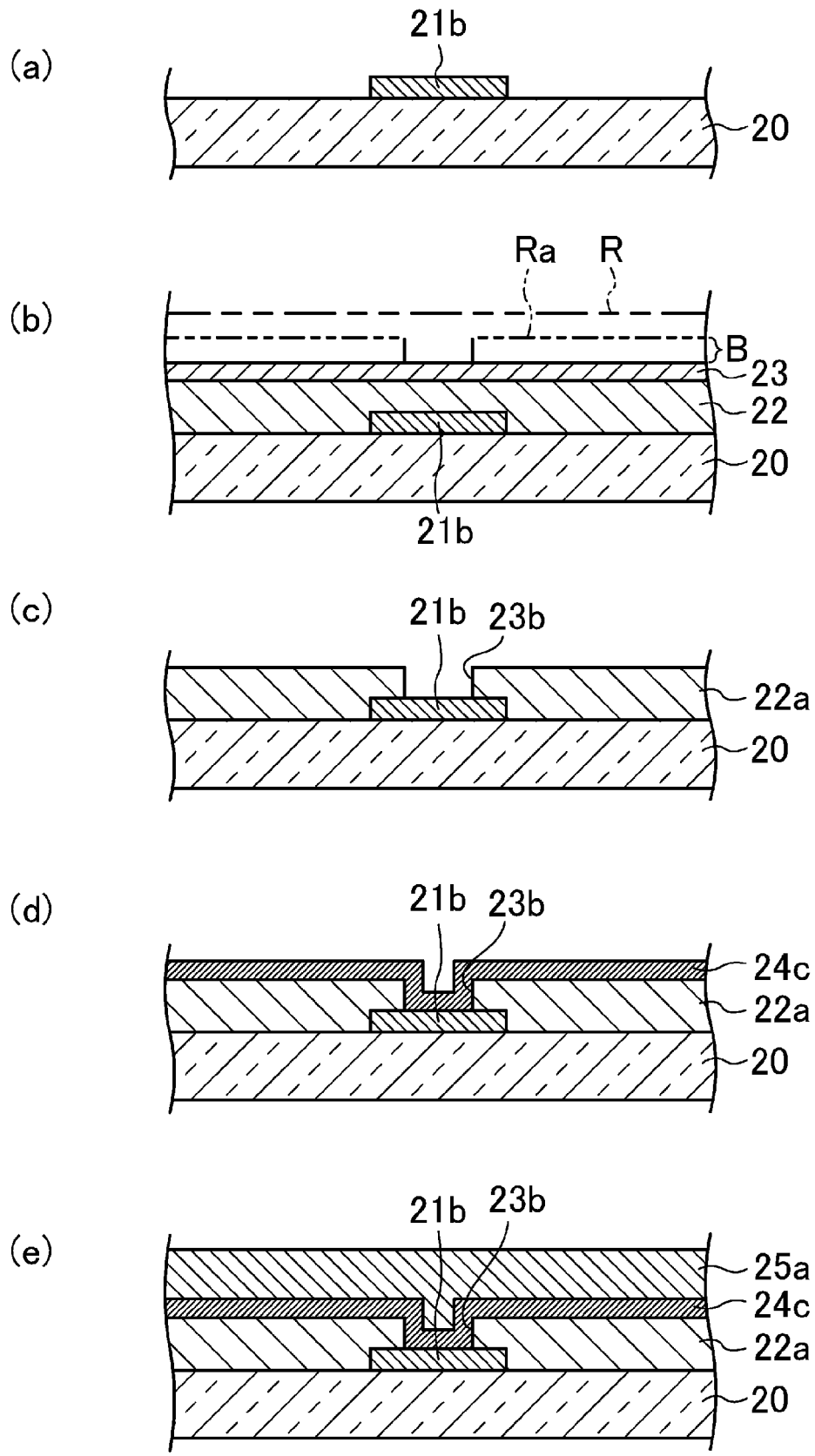
FIG. 8 is a cross-sectional view of a non-display region for describing the process of manufacturing the TFT substrate 50b.

FIG. 7 is a cross-sectional view of a display region for describing a process of manufacturing a TFT substrate 50b of this embodiment. FIG. 8 is a cross-sectional view of a non-display region for describing the process of manufacturing the TFT substrate 50b. Note that, in embodiments described below, the same parts as those of FIGS. 1-6 are indicated by the same reference characters and will not be described in detail.

In the first embodiment, the TFT 5a in which the source electrode 13a and the drain electrode 13b are provided below the semiconductor layer 14a has been illustrated. In this embodiment, a TFT 5b in which a source electrode 24a and a drain electrode 24b are provided above a semiconductor layer 23aa will be illustrated.

As shown in FIG. 7(f), the TFT substrate 50b includes a glass substrate 20, a plurality of gate lines (not shown) provided on the glass substrate 20, extending in parallel to each other, a plurality of source lines 24c (see FIGS. 8(d) and 8(e)) extending in parallel to each other in a direction orthogonal to the gate lines, a plurality of the TFTs 5b provided at respective corresponding intersections of the gate lines and the source lines 24c, i.e., each for every pixel, an interlayer insulating film 25a provided to cover the TFTs 5b, and a plurality of pixel electrodes 23ab provided in respective corresponding openings formed and arranged in a matrix in the interlayer insulating film 25a and connected to the respective corresponding TFTs 5b. Here, the source line 24c is extended to the non-display region and is connected to a first connection line 21b via a contact hole 23b formed in a gate insulating film 22a, so that an interconnection structure is formed at a substrate end portion (see FIGS. 8(d) and 8(e)).

As shown in FIG. 7(f), the TFT 5b includes a gate electrode 21a provided on the glass substrate 20, the gate insulating film 22a provided to cover the gate electrode 21a, a semiconductor layer 23aa provided on the gate insulating film 22a, overlapping the gate electrode 21a, and a source electrode 24a and a drain electrode 24b provided on the semiconductor layer 23aa, overlapping the gate electrode 21a and being separated apart from each other. Here, the gate electrode 21a is a portion protruding sideways from the gate line, and the source electrode 24a is a portion protruding sideways from the source line 24c and connected to a source region of the semiconductor layer 23aa. The drain electrode 24b is connected to a drain region of the semiconductor layer 23aa and the pixel electrode 23ab.

The semiconductor layer 23aa and the pixel electrode 23ab are formed of, for example, a transparent oxide semiconductor film made of IGZO, ISiZO, or IAlZO, etc. Here, as shown in FIGS. 7(e) and 7(f), the pixel electrode 23ab is a portion of an oxide semiconductor film 23 (oxide semiconductor layer 23a) which is exposed through the interlayer insulating film 25a, and has a lower electrical resistance than that of the semiconductor layer 23aa.

For example, the TFT substrate 50b thus configured, a CF substrate opposed to the TFT substrate 50b, and a liquid crystal layer sandwiched between these substrates constitute a liquid crystal display panel.

Next, a method for manufacturing the TFT substrate 50b of this embodiment will be described with reference to FIGS. 7 and 8. Note that the manufacturing method of this embodiment includes a gate layer formation step, a gate insulating film formation step, a source layer formation step, an interlayer insulating film formation step, and a pixel electrode formation step.

<Gate Layer Formation Step>

Initially, for example, a first metal conductive film (not shown), such as an aluminum film, a copper film, or a titanium film, etc., which has a thickness of about 3000 Å is formed on the entire glass substrate 20 having a thickness of 0.7 mm by sputtering.

Next, a photosensitive resin film (not shown) is applied onto the entire substrate on which the first metal conductive film has been formed, by spin coating, and thereafter, the photosensitive resin film is patterned using a first photomask (not shown) to form a first resist pattern (not shown).

Moreover, as shown in FIGS. 7(a) and 8(a), the first metal conductive film exposed through the first resist pattern is removed by wet etching, and thereafter, the first resist pattern is peeled off to form the gate line, the gate electrode 21a, and the first connection line 21b.

<Gate Insulating Film Formation Step>

Initially, the first inorganic insulating film 22, such as a silicon nitride film or a silicon oxide film, etc., which has a thickness of about 4000 Å is formed on the entire substrate on which the gate line, the gate electrode 21a, and the first connection line 21b have been formed in the gate layer formation step, by plasma-enhanced CVD (see FIGS. 7(b) and 8(b)).

Next, as shown in FIGS. 7(b) and 8(b), the oxide semiconductor film 23 made of IGZO, ISiZO, or IAlZO, etc., and having a thickness of about 1000 Å is formed on the entire substrate on which the first inorganic insulating film 22 has been formed, by sputtering.

Thereafter, a photosensitive resin film R (see FIGS. 7(b) and 8(b)) is applied onto the entire substrate on which the oxide semiconductor film 23 has been formed, by spin coating, and thereafter, the photosensitive resin film R is subjected to halftone exposure using a second photomask to form a second resist pattern Ra (see FIGS. 7(b) and 8(b)) having a recessed portion D.

Moreover, as shown in FIG. 8(c), the multilayer film of the first inorganic insulating film 22 and the oxide semiconductor film 23 exposed through the second resist pattern Ra is removed by dry etching to form the gate insulating film 22a having the contact hole 23b.

Next, a thickness of the second resist pattern Ra is reduced by ashing to form a modified second resist pattern Rb (see FIG. 7(b)) in which a bottom portion B of the recessed portion D of the second resist pattern Ra is removed.

Moreover, as shown in FIG. 7(c), the oxide semiconductor film 23 exposed through the modified second resist pattern Rb is removed by wet etching, and thereafter, the modified second resist pattern Rb is peeled off to form the oxide semiconductor layer 23a.

<Source Layer Formation Step>

Initially, a second metal conductive film 24 (see FIG. 7(d)), such as an aluminum film, a copper film, or a titanium film, etc., which has a thickness of about 3000 Å is formed on the entire substrate on which the gate insulating film 22a and the oxide semiconductor layer 23a have been formed in the gate insulating film formation step, by sputtering.

Next, a photosensitive resin film (not shown) is applied onto the entire substrate on which the second metal conductive film 24 has been formed, by spin coating, and thereafter, the photosensitive resin film is patterned using a third photomask (not shown) to form a third resist pattern (not shown).

Moreover, as shown in FIGS. 7(d) and 8(d), the second metal conductive film 24 exposed through the third resist pattern is removed by wet etching to form the source electrode 24a, the drain electrode 24b, and the source line 24c.

<Interlayer Insulating Film Formation Step>

Initially, a second inorganic insulating film 25 (see FIG. 7(e)), such as a silicon nitride film or a silicon oxide film, etc., which has a thickness of about 3000 Å is formed on the entire substrate on which the source electrode 24a, the drain electrode 24b, and the source line 24c have been formed in the source layer formation step, by sputtering or plasma-enhanced CVD.

Thereafter, a photosensitive resin film (not shown) is applied onto the entire substrate on which the second inorganic insulating film 25 has been formed, by spin coating, and thereafter, the photosensitive resin film is patterned using a fourth photomask (not shown) to form a fourth resist pattern (not shown).

Moreover, as shown in FIGS. 7(e) and 8(e), the second inorganic insulating film 25 exposed through the fourth resist pattern is removed by dry etching to form the interlayer insulating film 25a.

<Pixel Electrode Formation Step>

As shown in FIG. 7(f), the oxide semiconductor film 23a (see FIG. 7(e)) exposed through the interlayer insulating film 25a formed in the interlayer insulating film formation step is treated with a reducing plasma P to reduce the resistance of the oxide semiconductor film 23a exposed through the interlayer insulating film 25a, thereby forming the pixel electrode 23ab, and the semiconductor layer 23aa below the interlayer insulating film 25a.

Thus, the TFT substrate 50b of this embodiment can be manufactured.

As described above, according to the method for manufacturing the TFT substrate 50b of this embodiment, initially, in the gate layer formation step, the first metal conductive film is formed on the glass substrate 20, and thereafter, the first metal conductive film exposed through the first resist pattern formed using the first photomask is patterned to form the gate line, the gate electrode 21a, and the first connection line 21b. Next, in the gate insulating film formation step, the first inorganic insulating film 22 and the oxide semiconductor film 23 are successively formed on the gate line, the gate electrode 21a, and the first connection line 21b, and thereafter, the multilayer film of the first inorganic insulating film 22 and the oxide semiconductor film 23 exposed through the second resist pattern Ra formed using the second photomask is patterned to form the gate insulating film 22a having the contact hole 23b for forming an interconnection structure at the substrate end portion. Thereafter, in the source layer formation step, the second metal conductive film 24 is formed on the oxide semiconductor layer 23a, and thereafter, the second metal conductive film 24 exposed through the third resist pattern formed using the third photomask is patterned to form the source electrode 24a, the drain electrode 24b, and the source line (second interconnect) 24c. Here, the first connection line 21b and the source line 24c are connected to each other via the contact hole 23b formed in the gate insulating film 22a (the multilayer film of the first inorganic insulating film 22 and the oxide semiconductor film 23). Therefore, an interconnection structure can be specifically formed at the substrate end portion. Moreover, in the interlayer insulating film formation step, the second inorganic insulating film 25 is formed on the source electrode 24a, the drain electrode 24b, and the source line 24c, and thereafter, the second inorganic insulating film 25 exposed through the fourth resist pattern formed using the fourth photomask is patterned to form the interlayer insulating film 25a. Finally, in the pixel electrode formation step, the resistance of the oxide semiconductor layer 23a exposed through the interlayer insulating film 25a is reduced to form the pixel electrode 23ab. As a result, the TFT substrate 50b can be manufactured by using four of the first, second, third, and fourth photomasks, and therefore, a TFT substrate having an interconnection structure at a substrate end portion thereof can be manufactured at as low a cost as possible. In the manufactured TFT substrate 50b, a portion forming the TFT 5b of the oxide semiconductor film (the semiconductor layer 23aa) is covered with the interlayer insulating film 25a, and therefore, is less likely to be damaged by the reducing plasma P supplied for the resistance reduction, etc., resulting in satisfactory characteristics of the TFT 5b. Therefore, a TFT made of an oxide semiconductor and having satisfactory characteristics, and a TFT substrate having an interconnection structure at a substrate end portion thereof, can be manufactured at as low a cost as possible.

Also, according to the method for manufacturing the TFT substrate 50b of this embodiment, the gate electrode 21a is made wide enough to reach a boundary between the drain electrode 24b and the pixel electrode 23ab. Therefore, when the gate electrode 21a is maintained at a high voltage, then even if the resistance of the semiconductor layer 23aa below the drain electrode 24b is reduced and the source electrode 24a and the drain electrode 24b are formed on the semiconductor layer 23aa, the drain electrode 24b and the pixel electrode 23ab can be reliably connected to each other.

<<Third Embodiment of the Invention>>

Figure 10:
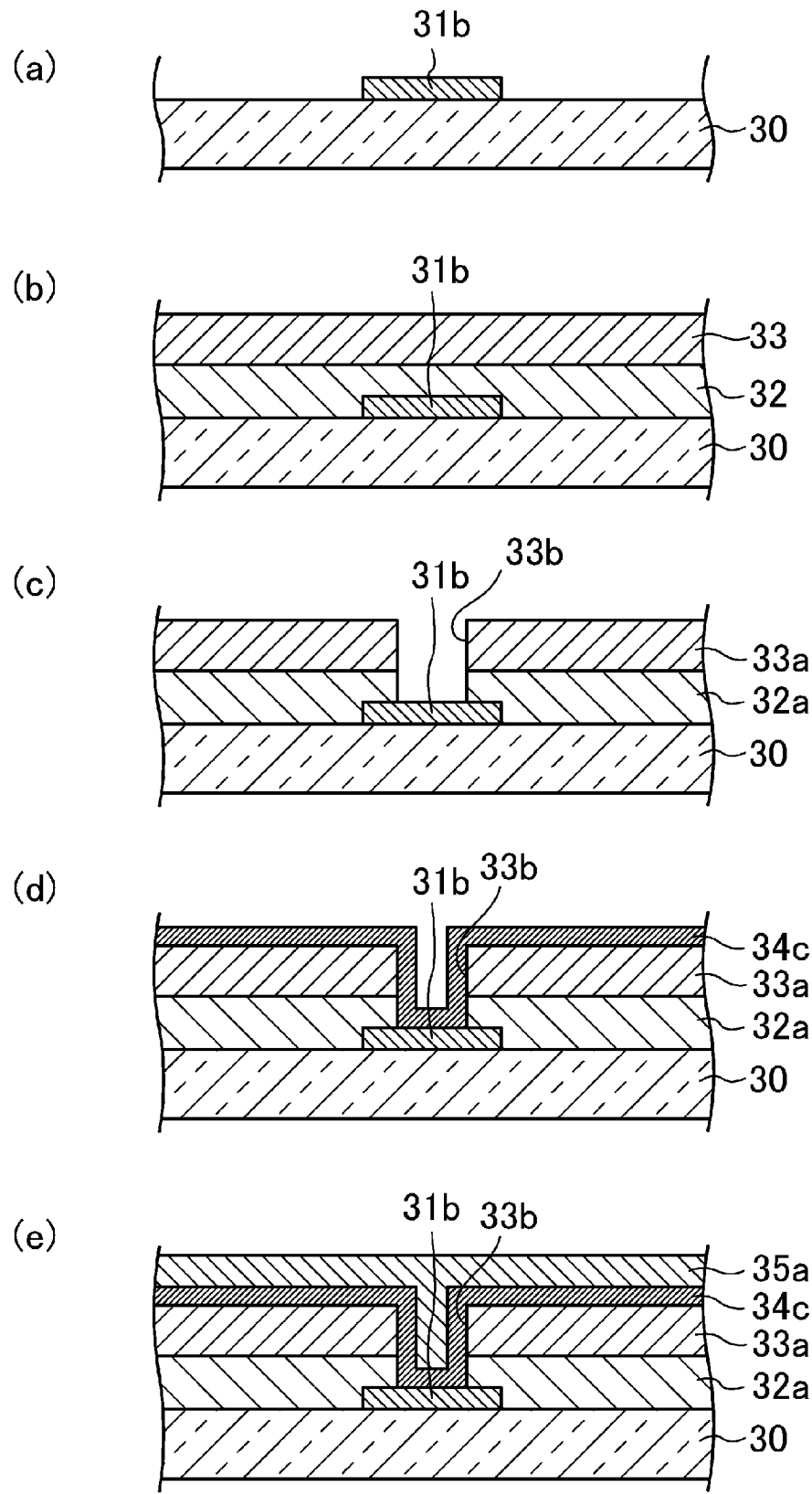
FIG. 10 is a cross-sectional view of a non-display region for describing the process of manufacturing the TFT substrate 50c.

FIG. 9 is a cross-sectional view of a display region for describing a process of manufacturing a TFT substrate 50c of this embodiment. FIG. 10 is a cross-sectional view of a non-display region for describing the process of manufacturing the TFT substrate 50c.

In the method for manufacturing the TFT substrate 50b of the second embodiment, the oxide semiconductor film 23 in the non-display region is removed using a resist pattern formed by halftone exposure. In the method for manufacturing the TFT substrate 50c of this embodiment, an oxide semiconductor film 33 in the non-display region is not removed.

As shown in FIG. 9(e), the TFT substrate 50c includes a glass substrate 30, a plurality of gate lines (not shown) provided on the glass substrate 30, extending in parallel to each other, a plurality of source lines 34c (see FIGS. 10(d) and 10(e)) extending in parallel to each other in a direction orthogonal to the gate lines, a plurality of TFTs 5c provided at respective corresponding intersections of the gate lines and the source lines 34c, i.e., each for every pixel, an interlayer insulating film 35a provided to cover the TFTs 5c, and a plurality of pixel electrodes 33ab provided in respective corresponding openings formed and arranged in a matrix in the interlayer insulating film 35a and connected to the respective corresponding TFTs 5c. Here, the source line 34c is extended to the non-display region and is connected to a first connection line 31b via a contact hole 33b formed in the multilayer film of the gate insulating film 32a and the oxide semiconductor layer 33a so that an interconnection structure is formed at a substrate end portion (see FIGS. 10(d) and 10(e)).

As shown in FIG. 9(e), the TFT 5c includes a gate electrode 31a provided on the glass substrate 30, the gate insulating film 32a provided to cover the gate electrode 31a, a semiconductor layer 33aa provided on the gate insulating film 32a, overlapping the gate electrode 31a, and a source electrode 34a and a drain electrode 34b provided on the semiconductor layer 33aa, overlapping the gate electrode 31a and being separated apart from each other. Here, the gate electrode 31a is a portion protruding sideways from the gate line, and the source electrode 34a is a portion protruding sideways from the source line 34c and connected to a source region of the semiconductor layer 33aa. The drain electrode 34b is connected to a drain region of the semiconductor layer 33aa and the pixel electrode 33ab.

The semiconductor layer 33aa and the pixel electrode 33ab are formed of, for example, a transparent oxide semiconductor film made of IGZO, ISiZO, or IAlZO, etc. Here, as shown in FIGS. 9(d) and 9(e), the pixel electrode 33ab is a portion of the oxide semiconductor film 33 (oxide semiconductor layer 33a) which is exposed through the interlayer insulating film 35a, and has a lower electrical resistance than that of the semiconductor layer 33aa.

For example, the TFT substrate 50c thus configured, a CF substrate opposed to the TFT substrate 50c, and a liquid crystal layer sandwiched between these substrates constitute a liquid crystal display panel.

Next, a method for manufacturing the TFT substrate 50c of this embodiment will be described with reference to FIGS. 9 and 10. Note that the manufacturing method of this embodiment includes a gate layer formation step, a gate insulating film formation step, a source layer formation step, an interlayer insulating film formation step, and a pixel electrode formation step.

<Gate Layer Formation Step>

Initially, for example, a first metal conductive film (not shown), such as an aluminum film, a copper film, or a titanium film, etc., which has a thickness of about 3000 Å is formed on the entire glass substrate 30 having a thickness of 0.7 mm by sputtering.

Next, a photosensitive resin film (not shown) is applied onto the entire substrate on which the first metal conductive film has been formed, by spin coating, and thereafter, the photosensitive resin film is patterned using a first photomask (not shown) to form a first resist pattern (not shown).

Moreover, as shown in FIGS. 9(a) and 10(a), the first metal conductive film exposed through the first resist pattern is removed by wet etching, and thereafter, the first resist pattern is peeled off to form the gate line, the gate electrode 31a, and the first connection line 31b.

<Gate Insulating Film Formation Step>

Initially, the first inorganic insulating film 32, such as a silicon nitride film or a silicon oxide film, etc., which has a thickness of about 4000 Å is formed on the entire substrate on which the gate line, the gate electrode 31a, and the first connection line 31b have been formed in the gate layer formation step, by plasma-enhanced CVD (see FIGS. 9(b) and 10(b)).

Next, as shown in FIGS. 9(b) and 10(b), the oxide semiconductor film 33 made of IGZO, ISiZO, or IAlZO, etc., and having a thickness of about 1000 Å is formed on the entire substrate on which the first inorganic insulating film 32 has been formed, by sputtering.

Thereafter, a photosensitive resin film (not shown) is applied onto the entire substrate on which the oxide semiconductor film 33 has been formed, by spin coating, and thereafter, the photosensitive resin film is patterned using a second photomask (not shown) to form a second resist pattern (not shown).

Moreover, as shown in FIGS. 10(c), the multilayer film of the first inorganic insulating film 32 and the oxide semiconductor film 33 exposed through the second resist pattern is removed by dry etching, and thereafter, the second resist pattern is peeled off to form the gate insulating film 32a (and the oxide semiconductor layer 33a) having the contact hole 33b.

<Source Layer Formation Step>

Initially, a second metal conductive film 34 (see FIG. 9(c)), such as an aluminum film, a copper film, or a titanium film, etc., which has a thickness of about 3000 Å is formed on the entire substrate on which the gate insulating film 32a and the oxide semiconductor layer 33a have been formed in the gate insulating film formation step, by sputtering.

Next, a photosensitive resin film (not shown) is applied onto the entire substrate on which the second metal conductive film 34 has been formed, by spin coating, and thereafter, the photosensitive resin film is patterned using a third photomask (not shown) to form a third resist pattern (not shown).

Moreover, as shown in FIGS. 9(c) and 10(d), the second metal conductive film 34 exposed through the third resist pattern is removed by wet etching to form the source electrode 34a, the drain electrode 34b, and the source line 34c.

<Interlayer Insulating Film Formation Step>

Initially, a second inorganic insulating film 35 (see FIG. 9(d)), such as a silicon nitride film or a silicon oxide film, etc., which has a thickness of about 3000 Å is formed on the entire substrate on which the source electrode 34a, the drain electrode 34b, and the source line 34c have been formed in the source layer formation step, by sputtering or plasma-enhanced CVD.

Thereafter, a photosensitive resin film (not shown) is applied onto the entire substrate on which the second inorganic insulating film 35 has been formed, by spin coating, and thereafter, the photosensitive resin film is patterned using a fourth photomask (not shown) to form a fourth resist pattern (not shown).

Moreover, as shown in FIGS. 9(d) and 10(e), the second inorganic insulating film 35 exposed through the fourth resist pattern is removed by dry etching to form the interlayer insulating film 35a.

<Pixel Electrode Formation Step>

As shown in FIG. 9(e), the oxide semiconductor film 33a (see FIG. 9(d)) exposed through the interlayer insulating film 35a formed in the interlayer insulating film formation step is treated with a reducing plasma P to reduce the resistance of the oxide semiconductor film 33a exposed through the interlayer insulating film 35a, thereby forming the pixel electrode 33ab, and the semiconductor layer 33aa below the interlayer insulating film 35a.

Thus, the TFT substrate 50c of this embodiment can be manufactured.

As described above, according to the method for manufacturing the TFT substrate 50c of this embodiment, initially, in the gate layer formation step, the first metal conductive film is formed on the glass substrate 30, and thereafter, the first metal conductive film exposed through the first resist pattern formed using the first photomask is patterned to form the gate line, the gate electrode 31a, and the first connection line (first interconnect) 31b. Next, in the gate insulating film formation step, the first inorganic insulating film 32 and the oxide semiconductor film 33 are successively formed on the gate line, the gate electrode 31a, and the first connection line 31b, and thereafter, the multilayer film of the first inorganic insulating film 32 and the oxide semiconductor film 33 exposed through the second resist pattern formed using the second photomask is patterned to form the gate insulating film 32a having the contact hole 33b for forming an interconnection structure at the substrate end portion. Thereafter, in the source layer formation step, the second metal conductive film 34 is formed on the oxide semiconductor layer 33a, and thereafter, the second metal conductive film 34 exposed through the third resist pattern formed using the third photomask is patterned to form the source electrode 34a, the drain electrode 34b, and the source line (second interconnect) 34c. Here, the first connection line 31b and the source line 34c are connected to each other via the contact hole 33b formed in the gate insulating film 32a (the multilayer film of the first inorganic insulating film 32 and the oxide semiconductor film 33). Therefore, an interconnection structure can be specifically formed at the substrate end portion. Moreover, in the interlayer insulating film formation step, the second inorganic insulating film 35 is formed on the source electrode 34a, the drain electrode 34b, and the source line 34c, and thereafter, the second inorganic insulating film 35 exposed through the fourth resist pattern formed using the fourth photomask is patterned to form the interlayer insulating film 35a. Finally, in the pixel electrode formation step, the resistance of the oxide semiconductor layer 33a exposed through the interlayer insulating film 35a is reduced to form the pixel electrode 33ab. As a result, the TFT substrate 50c can be manufactured by using four of the first, second, third, and fourth photomasks, and therefore, a TFT substrate having an interconnection structure at a substrate end portion thereof can be manufactured at as low a cost as possible. In the manufactured TFT substrate 50c, a portion forming the TFT 5c of the oxide semiconductor film (the semiconductor layer 33aa) is covered with the interlayer insulating film 35a, and therefore, is less likely to be damaged by the reducing plasma P supplied for the resistance reduction, etc., resulting in satisfactory characteristics of the TFT 5c. Therefore, a TFT made of an oxide semiconductor and having satisfactory characteristics, and a TFT substrate having an interconnection structure at a substrate end portion thereof, can be manufactured at as low a cost as possible. Also, according to the method for manufacturing the TFT substrate 50c of this embodiment, a photomask for halftone exposure used in the second embodiment is not required, and therefore, a TFT substrate can be manufactured more easily and at a lower cost than when the manufacturing method of the second embodiment is used.

<<Fourth Embodiment of the Invention>>

Figure 11:
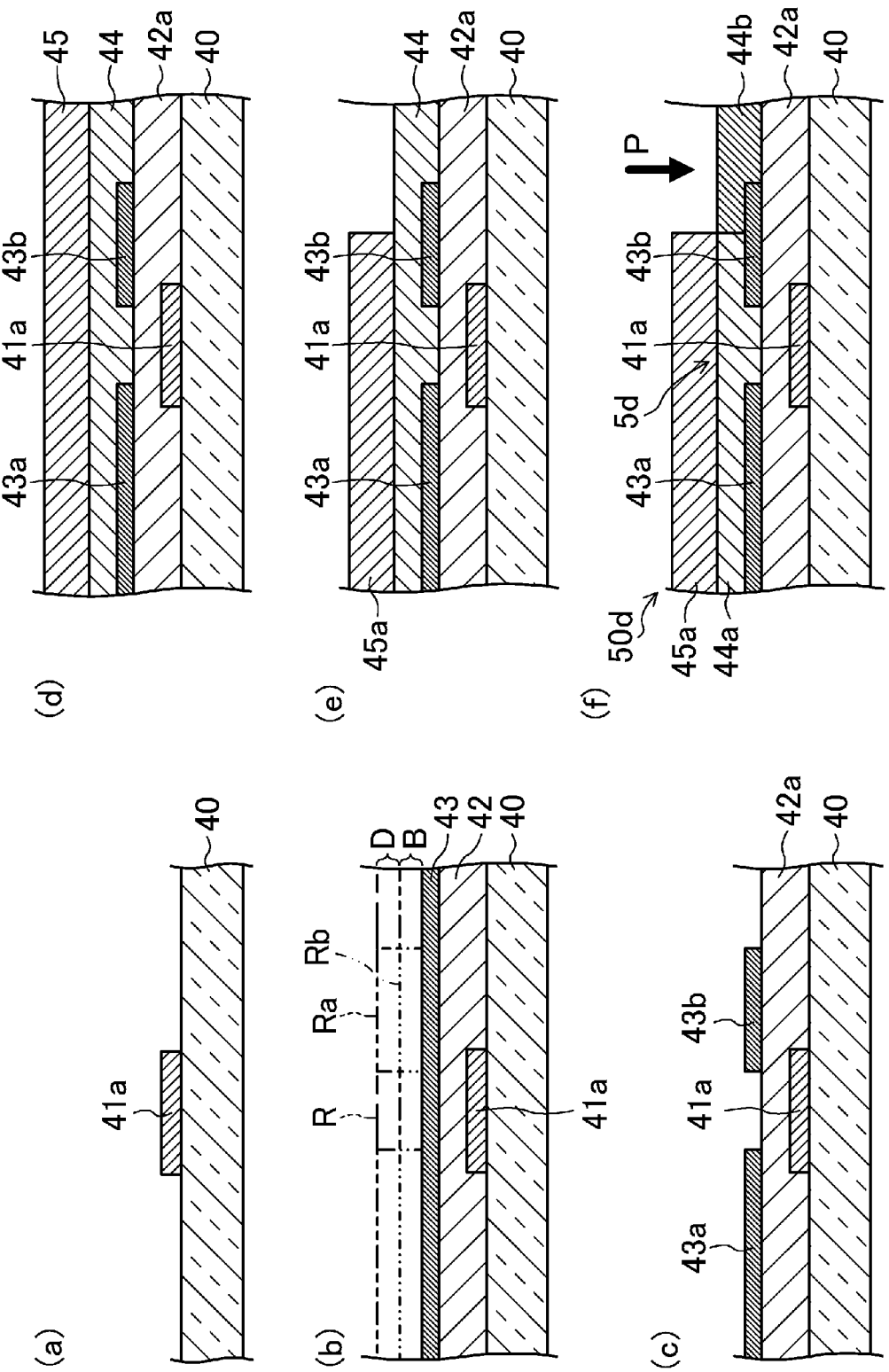
FIG. 11 is a cross-sectional view of a display region for describing a process of manufacturing a TFT substrate 50d according to a fourth embodiment.
Figure 12:
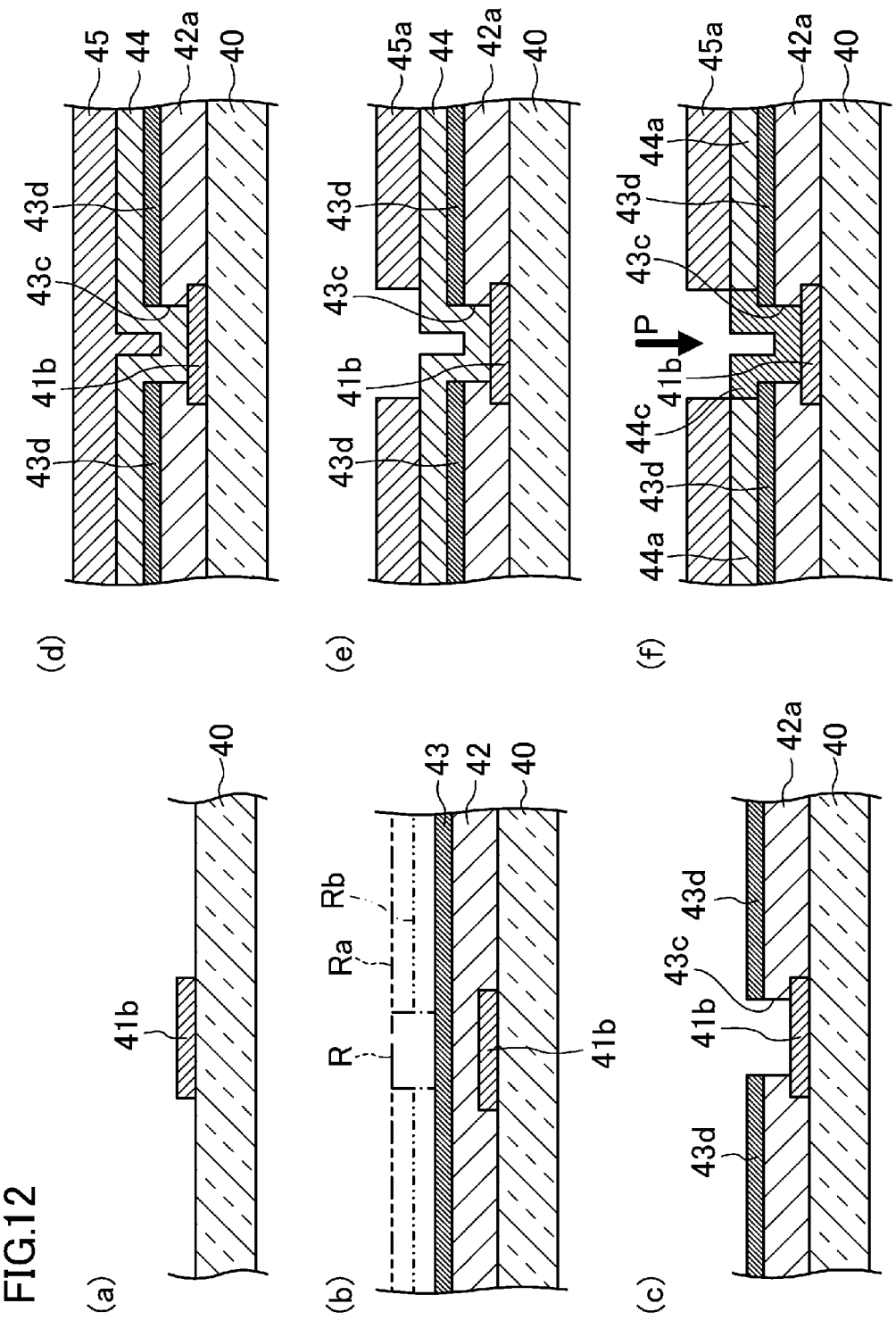
FIG. 12 is a cross-sectional view of a non-display region for describing the process of manufacturing the TFT substrate 50d.
Figure 13:
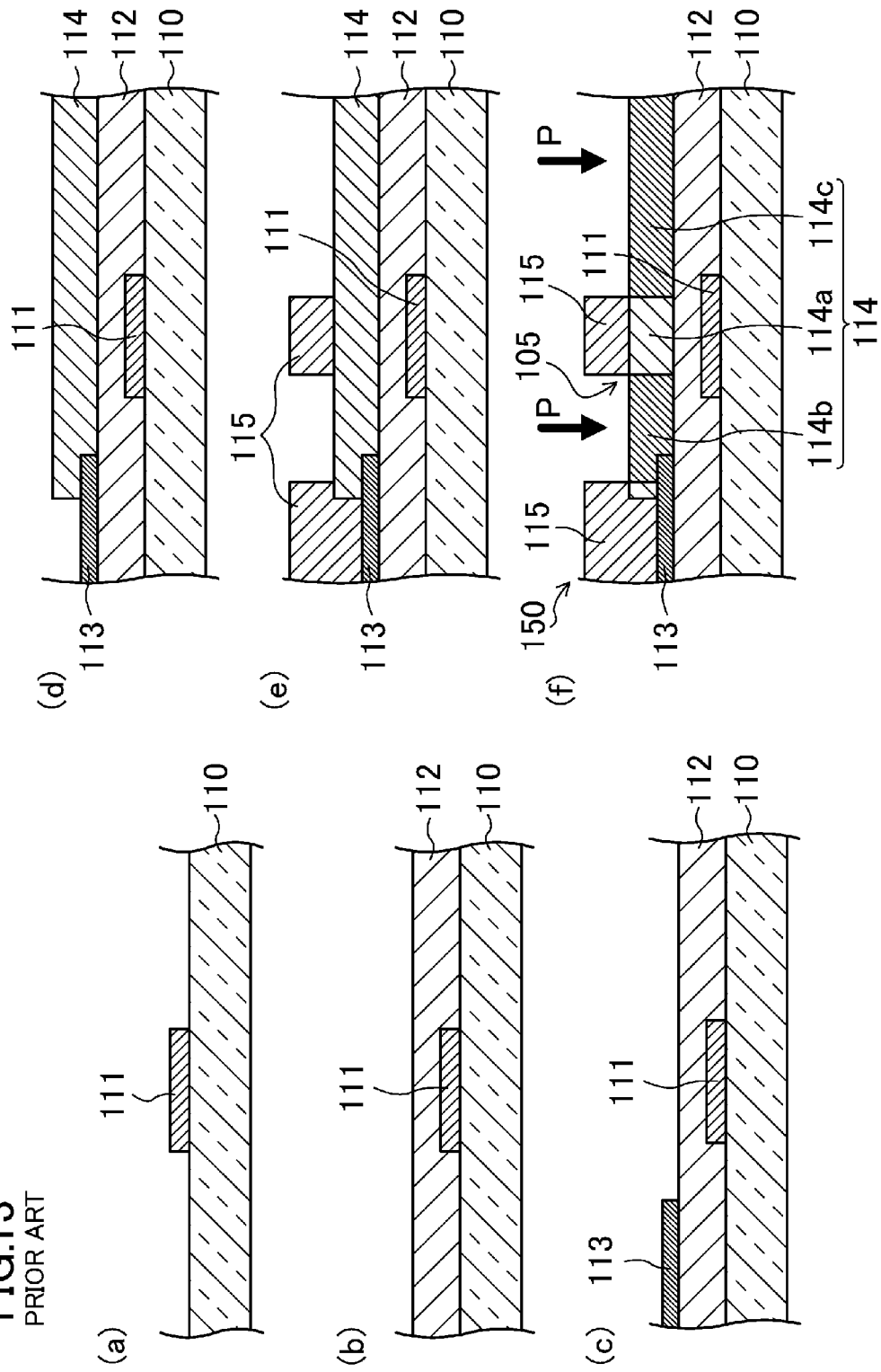
FIG. 13 is a cross-sectional view for describing a process of manufacturing a conventional the TFT substrate 150.

FIG. 11 is a cross-sectional view of a display region for describing a process of manufacturing a TFT substrate 50d of this embodiment. FIG. 12 is a cross-sectional view of a non-display region for describing the process of manufacturing the TFT substrate 50d.

In the embodiments described above, a method for manufacturing a TFT substrate using four photomasks has been illustrated. In this embodiment, a method for manufacturing a TFT substrate using three photomasks will be illustrated.

As shown in FIG. 11(f), the TFT substrate 50d includes a glass substrate 40, a plurality of gate lines (not shown) provided on the glass substrate 40, extending in parallel to each other, a plurality of source lines (not shown) extending in parallel to each other in a direction orthogonal to the gate lines, a plurality of TFTs 5d provided at respective corresponding intersections of the gate lines and the source lines, i.e., each for every pixel, an interlayer insulating film 45a provided to cover the TFTs 5d, and a plurality of pixel electrodes 44b provided in respective corresponding openings formed and arranged in a matrix in the interlayer insulating film 45a and connected to the respective corresponding TFTs 5d. Here, in the non-display region of the TFT substrate 50d, the first connection line 41b extending along the gate line and the second connection line 43d extending along the source line are connected to each other via a conductive portion 44c provided inside a contact hole 43c formed in an gate insulating film 42a (a multilayer film of a first inorganic insulating film 42 and a second metal conductive film 43) so that an interconnection structure is formed at a substrate end portion (see FIG. 12(f)).

As shown in FIG. 11(f), the TFT 5d includes a gate electrode 41a provided on the glass substrate 40, the gate insulating film 42a provided to cover the gate electrode 41a, a source electrode 43a and a drain electrode 43b provided on the gate insulating film 42a, overlapping the gate electrode 41a and being separated apart from each other, and a semiconductor layer 44a provided on the gate insulating film 42a, overlapping the gate electrode 41a with the source electrode 43a and the drain electrode 43b being interposed between the semiconductor layer 44a and the gate electrode 41a. Here, the gate electrode 41a is a portion protruding sideways from the gate line, and the source electrode 43a is a portion protruding sideways from the source line and connected to a source region of the semiconductor layer 44a. The drain electrode 43b is connected to a drain region of the semiconductor layer 44a and the pixel electrode 44b.

The semiconductor layer 44a and the pixel electrode 44b are formed of, for example, a transparent oxide semiconductor film made of IGZO, ISiZO, or IAlZO, etc. Here, as shown in FIGS. 11(e) and 11(f), the pixel electrode 44b is a portion of an oxide semiconductor film 44 which is exposed through the interlayer insulating film 45a, and has a lower electrical resistance than that of the semiconductor layer 44a.

For example, the TFT substrate 50d thus configured, a CF substrate opposed to the TFT substrate 50d, and a liquid crystal layer sandwiched between these substrates constitute a liquid crystal display panel.

Next, a method for manufacturing the TFT substrate 50d of this embodiment will be described with reference to FIGS. 11 and 12. Note that the manufacturing method of this embodiment includes a gate layer formation step, a gate insulating film formation step, a source layer formation step, an interlayer insulating film formation step, and a pixel electrode formation step.

<Gate Layer Formation Step>

Initially, for example, a first metal conductive film (not shown), such as an aluminum film, a copper film, or a titanium film, etc., which has a thickness of about 3000 Å is formed on the entire glass substrate 40 having a thickness of 0.7 mm by sputtering.

Next, a photosensitive resin film (not shown) is applied onto the entire substrate on which the first metal conductive film has been formed, by spin coating, and thereafter, the photosensitive resin film is patterned using a first photomask (not shown) to form a first resist pattern (not shown).

Moreover, as shown in FIGS. 11(a) and 12(a), the first metal conductive film exposed through the first resist pattern is removed by wet etching, and thereafter, the first resist pattern is peeled off to form the gate line, the gate electrode 41a, and the first connection line 41b.

<Gate Insulating Film Formation Step>

Initially, the first inorganic insulating film 42 (see FIGS. 11(b) and 12(b)), such as a silicon nitride film or a silicon oxide film, etc., which has a thickness of about 4000 Å is formed on the entire substrate on which the gate line, the gate electrode 41a, and the first connection line 41b have been formed in the gate layer formation step, by plasma-enhanced CVD.

Next, as shown in FIGS. 11(b) and 12(b), the second metal conductive film 43, such as an aluminum film, a copper film, or a titanium film, etc., which has a thickness of about 3000 Å is formed on the entire substrate on which the first inorganic insulating film 42 has been formed, by sputtering.

Thereafter, a photosensitive resin film R (see FIGS. 11(b) and 12(b)) is applied onto the entire substrate on which the second metal insulating film 43 has been formed, by spin coating, and thereafter, the photosensitive resin film R is subjected to halftone exposure using a second photomask to form a second resist pattern Ra (see FIGS. 11(b) and 12(b)) having a recessed portion D.

Moreover, the multilayer film of the first inorganic insulating film 42 and the metal insulating film 43 exposed through the second resist pattern Ra is removed by dry etching to form the gate insulating film 42a (see FIG. 12(c)) having the contact hole 43c.

<Source Layer Formation Step>

Initially, a thickness of the second resist pattern Ra used in the gate insulating film formation step is reduced by ashing to form a modified second resist pattern Rb (see FIGS. 11(b) and 12(b)) in which a bottom portion B of the recessed portion D of the second resist pattern Ra is removed.

Next, as shown in FIGS. 11(c) and 12(c), the second metal conductive film 43 exposed through the modified second resist pattern Rb is removed by wet etching, and thereafter, the modified second resist pattern Rb is peeled off to form the source electrode 43a, the drain electrode 43b, the source line, and the second connection line 43d.

<Interlayer Insulating Film Formation Step>

Initially, the oxide semiconductor film 44 made of IGZO, ISiZO, or IAlZO, etc., and having a thickness of about 1000 Å is formed on the entire substrate on which the source electrode 43a, the drain electrode 43b, the source line, and the second connection line 43d have been formed in the source layer formation step, by sputtering (see FIGS. 11(d) and 12(d)).

Next, as shown in FIGS. 11(d) and 12(d), a second inorganic insulating film 45, such as a silicon nitride film or a silicon oxide film, etc., which has a thickness of about 3000 Å is formed on the entire substrate on which the oxide semiconductor film 44 has been formed, by sputtering or plasma-enhanced CVD.

Thereafter, a photosensitive resin film (not shown) is applied onto the entire substrate on which the second inorganic insulating film 45 has been formed, by spin coating, and thereafter, the photosensitive resin film is patterned using a third photomask (not shown) to form a third resist pattern (not shown).

Moreover, as shown in FIGS. 11(e) and 12(e), the second inorganic insulating film 45 exposed through the third resist pattern is removed by dry etching to form the interlayer insulating film 45a.

<Pixel Electrode Formation Step>

As shown in FIGS. 11(f) and 12(f), the oxide semiconductor film 44 (see FIGS. 11(e) and 12(e)) exposed through the interlayer insulating film 45a formed in the interlayer insulating film formation step is treated with a reducing plasma P to reduce the resistance of the oxide semiconductor film 44 exposed through the interlayer insulating film 45a, thereby forming the pixel electrode 44b and a conductive layer 44c, and the semiconductor layer 44a below the interlayer insulating film 45a.

Thus, the TFT substrate 50d of this embodiment can be manufactured.

As described above, according to the method for manufacturing the TFT substrate 50d of this embodiment, initially, in the gate layer formation step, the first metal conductive film is formed on the glass substrate 40, and thereafter, the first metal conductive film exposed through the first resist pattern formed using the first photomask is patterned to form the gate line, the gate electrode 41a, and the first connection line (first interconnect) 41b. Next, in the gate insulating film formation step, initially, the first inorganic insulating film 42, the second metal conductive film 43, and the photosensitive resin R are successively formed on the gate line, the gate electrode 41a, and the first connection line 41b, and thereafter, the photosensitive resin film R is subjected to halftone exposure using the second photomask to form the second resist pattern Ra. Next, the multilayer film of the first inorganic insulating film 42 and the second metal conductive film 43 exposed through the second resist pattern Ra is etched to form the gate insulating film 42a having the contact hole 43c. Thereafter, in the source layer formation step, the thickness of the second resist pattern Ra is reduced to remove the bottom portion B of the recessed portion D of the second resist pattern Ra, thereby exposing the second metal conductive film 43. The exposed second metal conductive film 43 is etched to form the source electrode 43a, the drain electrode 43b, the source line, and the second connection line (second interconnect) 43d. Moreover, in the interlayer insulating film formation step, the oxide semiconductor film 44 and the second inorganic insulating film 45 are successively formed on the source electrode 43a, the drain electrode 43b, the source line, and the second connection line 43d, and thereafter, the second inorganic insulating film 45 exposed through the third resist pattern formed using the third photomask is patterned to form the interlayer insulating film 45a. Finally, in the pixel electrode formation step, the resistance of the oxide semiconductor film 44 exposed through the interlayer insulating film 45a is reduced to form the pixel electrode 44b, and the first connection line 41b and the second connection line 43d are caused to be conductive. Here, the first connection line 41b and the second connection line 43d are connected to each other via the conductive portion 44c having the reduced resistance of the oxide semiconductor film 44 inside the contact hole 43c formed in the gate insulating film 42a (the multilayer film of the first inorganic insulating film 42 and the second metal conductive film 43). Thus, an interconnection structure can be specifically formed at the substrate end portion. As a result, the TFT substrate 50d can be manufactured by using three of the first, second, and third photomasks, and therefore, a TFT substrate having an interconnection structure at a substrate end portion thereof can be manufactured at as low a cost as possible. In the manufactured TFT substrate 50d, a portion forming the TFT 5d of the oxide semiconductor film (the semiconductor layer 44a) is covered with the interlayer insulating film 45a, and therefore, is less likely to be damaged by the reducing plasma P supplied for the resistance reduction, etc., resulting in satisfactory characteristics of the TFT 5d. Therefore, a TFT made of an oxide semiconductor and having satisfactory characteristics, and a TFT substrate having an interconnection structure at a substrate end portion thereof, can be manufactured at as low a cost as possible.

In the second to fourth embodiments, an example method for forming a pixel electrode by treating an oxide semiconductor film with a plasma and thereby reducing the resistance of a portion of the oxide semiconductor film has been described. Alternatively, as described in the first embodiment, a pixel electrode may be formed by implanting an impurity, such as a hydrogen ion etc., into an oxide semiconductor film or reducing the thickness of an oxide semiconductor film by wet etching and thereby reducing the resistance of a portion of the oxide semiconductor film.

In the above embodiments, a TFT substrate in which an electrode of the TFT which is connected to the pixel electrode serves as a drain electrode has been illustrated. Alternatively, the present invention is also applicable to a TFT substrate in which an electrode of the TFT which is connected to the pixel electrode is called a source electrode.

Industrial Applicability

As described above, according to the present invention, a TFT substrate can be manufactured at a low cost. Therefore, the present invention is useful for display panels, such as an active matrix drive liquid crystal display panel, an organic EL display panel, etc.

Description Of Reference Characters

B BOTTOM PORTION
D RECESSED PORTION
H IMPURITY
P PLASMA
R PHOTOSENSITIVE RESIN FILM
Ra SECOND RESIST PATTERN
10, 20, 30, 40 GLASS SUBSTRATE
11a, 21a, 31a, 41a GATE ELECTRODE
11 GATE LINE (FIRST INTERCONNECT)
12, 22, 32, 42 FIRST INORGANIC INSULATING FILM
12a, 22a, 32a, 42a GATE INSULATING FILM
12b, 23b, 33b, 43c CONTACT HOLE
13, 24, 34, 43 SECOND METAL CONDUCTIVE FILM
13a, 24a, 34a, 43a SOURCE ELECTRODE
13b, 24b, 34b, 43b DRAIN ELECTRODE
13c, 24c, 34c SOURCE LINE (SECOND INTERCONNECT)
13d, 43d SECOND CONNECTION LINE (SECOND INTERCONNECT)
14, 23, 33, 44 OXIDE SEMICONDUCTOR FILM
14b, 23ab, 33ab, 44b PIXEL ELECTRODE
15, 25, 35, 45 SECOND INORGANIC 1INSULATING FILM
15a, 25a, 35a, 45a INTERLAYER INSULATING FILM
21b, 31b, 41b FIRST CONNECTION LINE (FIRST INTERCONNECT)
24c, 34c SOURCE LINE (SECOND INTERCONNECT)
50aa, 50ab, 50ac, 50b, 50c, 50d TFT SUBSTRATE

The invention claimed is:

1. A method for manufacturing a thin film transistor substrate, comprising:
a gate layer formation step of forming a gate electrode and a first interconnect on a substrate;
a gate insulating film formation step of forming a first insulating film covering the gate electrode and the first interconnect, and thereafter, patterning the first insulating film to form a contact hole at a position overlapping the first interconnect, thereby forming a gate insulating film;
a source layer formation step of forming a conductive film covering the gate insulating film, and thereafter, patterning the conductive film to form a source electrode and a drain electrode overlapping the gate electrode and separated apart from each other, and a second interconnect intersecting the first interconnect and connected via the contact hole to the first interconnect;
an interlayer insulating film formation step of successively forming an oxide semiconductor film and a second insulating film covering the source electrode, the drain electrode, and the second interconnect, and thereafter, patterning the second insulating film to form an interlayer insulating film; and a pixel electrode formation step of reducing the resistance of the oxide semiconductor film exposed through the interlayer insulating film to form a pixel electrode.

2. A method for manufacturing a thin film transistor substrate, comprising:

a gate layer formation step of forming a gate electrode and a first interconnect on a substrate;

a gate insulating film formation step of successively forming a first insulating film and an oxide semiconductor film covering the gate electrode and the first interconnect, and thereafter, patterning the multilayer film of the first insulating film and the oxide semiconductor film to form a contact hole at a position overlapping the first interconnect, thereby forming a gate insulating film;

a source layer formation step of forming a conductive film covering the oxide semiconductor film, and thereafter, patterning the conductive film to form a source electrode and a drain electrode overlapping the gate electrode and separated apart from each other, and a second interconnect intersecting the first interconnect and connected via the contact hole to the first interconnect;

an interlayer insulating film formation step of forming a second insulating film covering the source electrode, the drain electrode, and the second interconnect, and thereafter, patterning the second insulating film to form an interlayer insulating film; and a pixel electrode formation step of reducing the resistance of the oxide semiconductor film exposed through the interlayer insulating film to form a pixel electrode.

3. The method of claim 2, wherein in the gate layer formation step, the gate electrode is made wide enough to reach a boundary between the drain electrode formed in the source layer formation step and the pixel electrode formed in the pixel electrode formation step.

4. A method for manufacturing a thin film transistor substrate, comprising:

a gate layer formation step of forming a gate electrode and a first interconnect on a substrate;

a gate insulating film formation step of successively forming a first insulating film and a conductive film covering the gate electrode and the first interconnect, and thereafter, patterning the multilayer film of the first insulating film and the conductive film to form a contact hole at a position overlapping the first interconnect, thereby forming a gate insulating film;

a source layer formation step of patterning the conductive film to form a source electrode and a drain electrode overlapping the gate electrode and separated apart from each other, and a second interconnect intersecting the first interconnect at the position of the contact hole;

an interlayer insulating film formation step of successively forming an oxide semiconductor film and a second insulating film covering the source electrode, the drain electrode, and the second interconnect, and thereafter, patterning the second insulating film to form an interlayer insulating film; and a pixel electrode formation step of reducing the resistance of the oxide semiconductor film exposed through the interlayer insulating film to form a pixel electrode, and causing the first and second interconnects to be conductive.

5. The method of claim 4, wherein the gate insulating film formation step includes a step of forming a photosensitive resin film on the conductive film and performing a halftone exposure of the photosensitive resin film to form a resist pattern with a recessed portion, and a step of etching the multilayer film of the first insulating film and the conductive film exposed through the resist pattern to form the contact hole, and in the source layer formation step, a thickness of the resist pattern is reduced to remove a bottom portion of the recessed portion of the resist pattern to expose the conductive film, and the exposed conductive film is patterned by etching.

6. The method of claim 1, wherein in the pixel electrode formation step, the oxide semiconductor film exposed through the interlayer insulating film is treated with a plasma.

7. The method of claim 1, wherein in the pixel electrode formation step, an impurity is implanted into the oxide semiconductor film exposed through the interlayer insulating film.

8. The method of claim 1, wherein in the pixel electrode formation step, a thickness of the oxide semiconductor film exposed through the interlayer insulating film is reduced by etching.

9. The method of claim 1, wherein the second interconnect is a source line conductive to the source electrode, and the first interconnect is a first connection line configured to connect to the source line.

10. The method of claim 1, wherein the first interconnect is a gate line conductive to the gate electrode, and the second interconnect is a second connection line configured to connect to the gate line.

11. The method of claim 1, wherein the oxide semiconductor film is made of In-Ga-Zn-O.

* * * * *